(12) United States Patent
Yu et al.

(10) Patent No.: US 12,476,135 B2
(45) Date of Patent: Nov. 18, 2025

(54) SEMICONDUCTOR PACKAGE AND METHOD

(71) Applicant: Taiwan Semiconductor Manufacturing Co., Ltd., Hsinchu (TW)

(72) Inventors: Chen-Hua Yu, Hsinchu (TW); Wei-Yu Chen, Hsinchu (TW); Jiun Yi Wu, Zhongli (TW); Chung-Shi Liu, Hsinchu (TW); Chien-Hsun Lee, Chu-tung Town (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/205,383

(22) Filed: Mar. 18, 2021

(65) Prior Publication Data

US 2022/0199461 A1    Jun. 23, 2022

Related U.S. Application Data

(60) Provisional application No. 63/127,299, filed on Dec. 18, 2020.

(51) Int. Cl.
*H01L 23/31*    (2006.01)
*H01L 21/56*    (2006.01)
(Continued)

(52) U.S. Cl.
CPC ........ *H01L 21/76802* (2013.01); *H01L 21/56* (2013.01); *H01L 23/31* (2013.01);
(Continued)

(58) Field of Classification Search
CPC .................. H01L 21/76802; H01L 21/56
See application file for complete search history.

(56) References Cited

U.S. PATENT DOCUMENTS 8,987,922 B2   3/2015   Yu et al.
8,993,380 B2   3/2015   Hou et al.
(Continued)

FOREIGN PATENT DOCUMENTS

CN    106486383 A    3/2017
CN    109786266 A    5/2019
(Continued)

*Primary Examiner* — Trang Q Tran
(74) *Attorney, Agent, or Firm* — Slater Matsil, LLP

(57) ABSTRACT

A method includes attaching interconnect structures to a carrier substrate, wherein each interconnect structure includes a redistribution structure; a first encapsulant on the redistribution structure; and a via extending through the encapsulant to physically and electrically connect to the redistribution structure; depositing a second encapsulant on the interconnect structures, wherein adjacent interconnect structures are laterally separated by the second encapsulant; after depositing the second encapsulant, attaching a first core substrate to the redistribution structure of at least one interconnect structure, wherein the core substrate is electrically connected to the redistribution structure; and attaching semiconductor devices to the interconnect structures, wherein the semiconductor devices are electrically connected to the vias of the interconnect structures.

19 Claims, 38 Drawing Sheets

(51) Int. Cl.
*H01L 21/768* (2006.01)
*H01L 23/538* (2006.01)
*H01L 21/60* (2006.01)

(52) U.S. Cl.
CPC ...... *H01L 23/5384* (2013.01); *H01L 23/5386* (2013.01); *H01L 2021/60022* (2013.01)

(56) References Cited

U.S. PATENT DOCUMENTS

| | | | |
|---|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,768,145 B2 | 9/2017 | Yu et al. |
| 11,670,518 B2 | 6/2023 | Jin |
| 2013/0075936 A1* | 3/2013 | Lin ............... H01L 25/105 438/109 |
| 2013/0270682 A1 | 10/2013 | Hu et al. |
| 2014/0103488 A1* | 4/2014 | Chen ............... H01L 24/19 257/532 |
| 2015/0200185 A1* | 7/2015 | Yu ............... H01L 23/49838 257/737 |
| 2016/0148903 A1 | 5/2016 | Su et al. |
| 2016/0276307 A1 | 9/2016 | Lin |
| 2017/0062383 A1 | 3/2017 | Yee et al. |
| 2017/0250171 A1* | 8/2017 | Yu ............... H01L 24/19 |
| 2017/0271203 A1 | 9/2017 | Liu et al. |
| 2018/0323150 A1* | 11/2018 | Yu ............... H01L 25/0655 |
| 2019/0148276 A1* | 5/2019 | Chen ............... H01L 21/486 257/774 |
| 2019/0178276 A1 | 6/2019 | Hansen |
| 2020/0006241 A1 | 1/2020 | Wu et al. |
| 2020/0058632 A1 | 2/2020 | Chen et al. |
| 2020/0075488 A1 | 3/2020 | Wu et al. |
| 2020/0194393 A1* | 6/2020 | Wu ............... H01L 23/3135 |

FOREIGN PATENT DOCUMENTS

| | | |
|---|---|---|
| CN | 110993585 A | 4/2020 |
| DE | 102019117006 A1 | 1/2020 |
| KR | 20160063241 A | 6/2016 |
| KR | 20130115073 A | 10/2016 |
| KR | 20200027419 A | 3/2020 |
| TW | 201731054 A | 9/2017 |

* cited by examiner

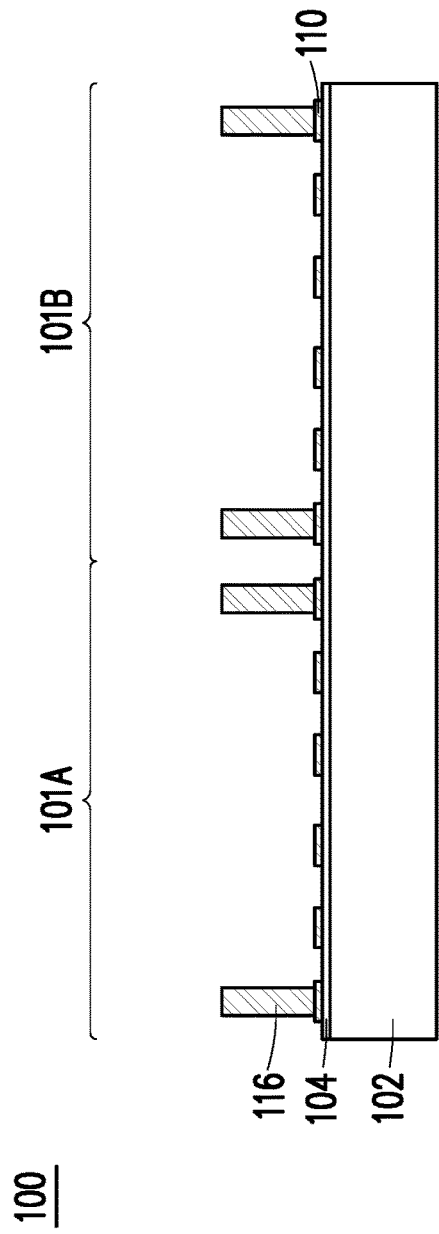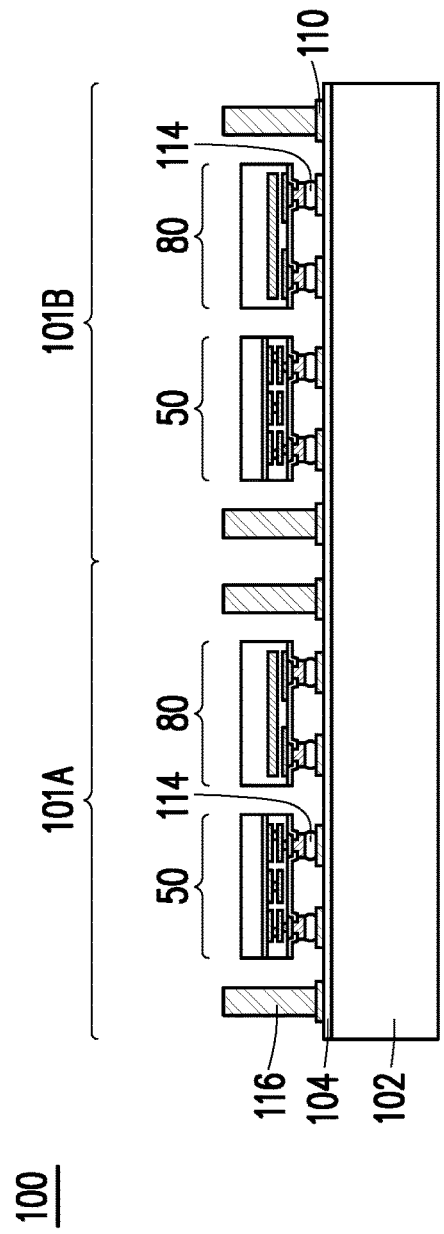

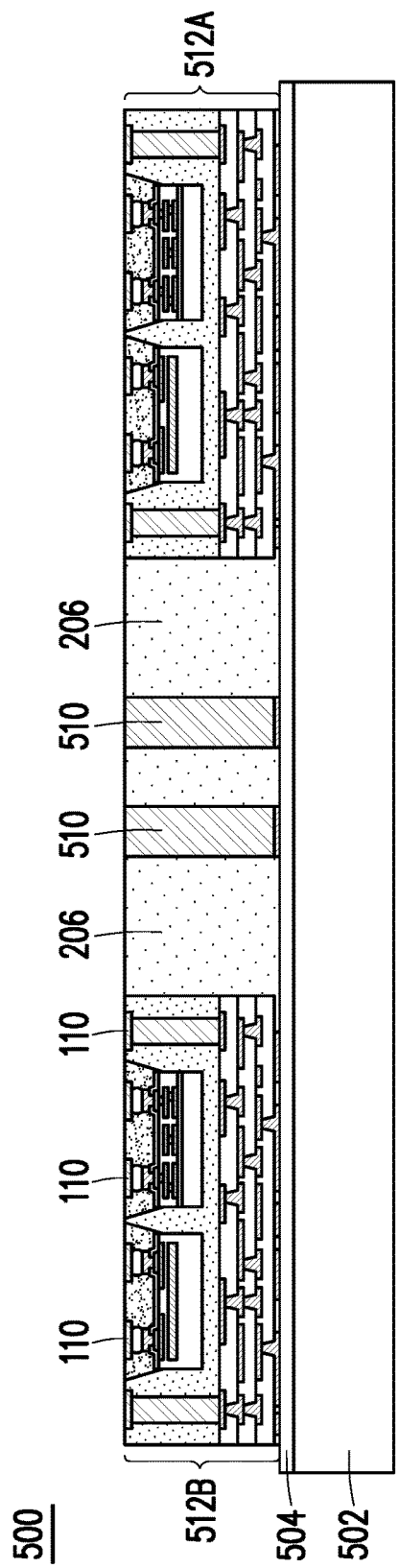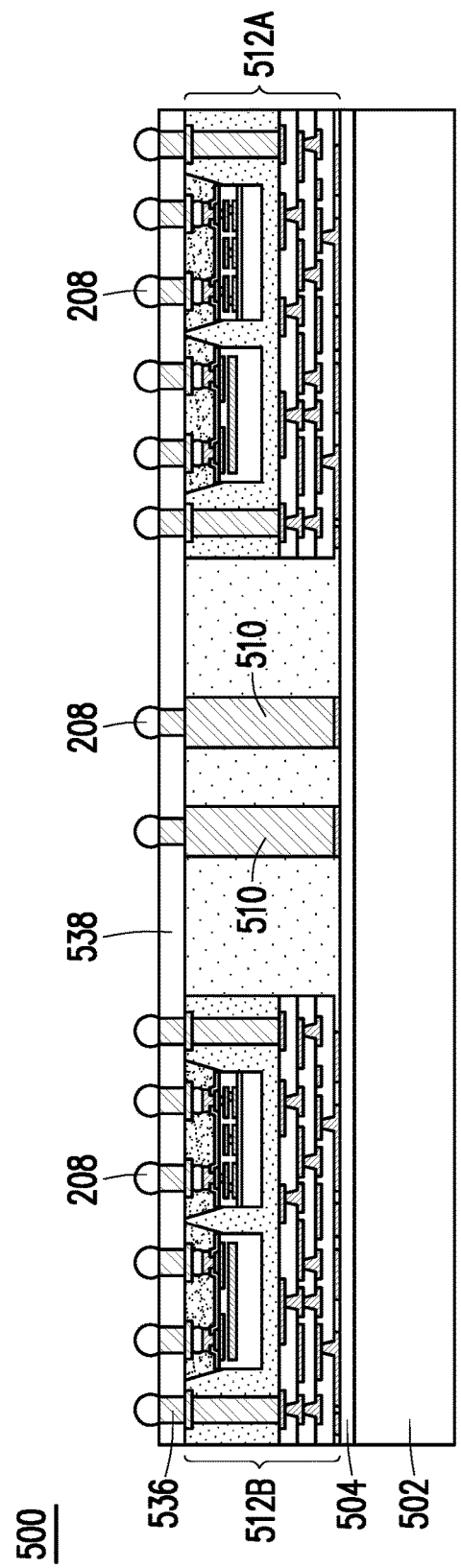

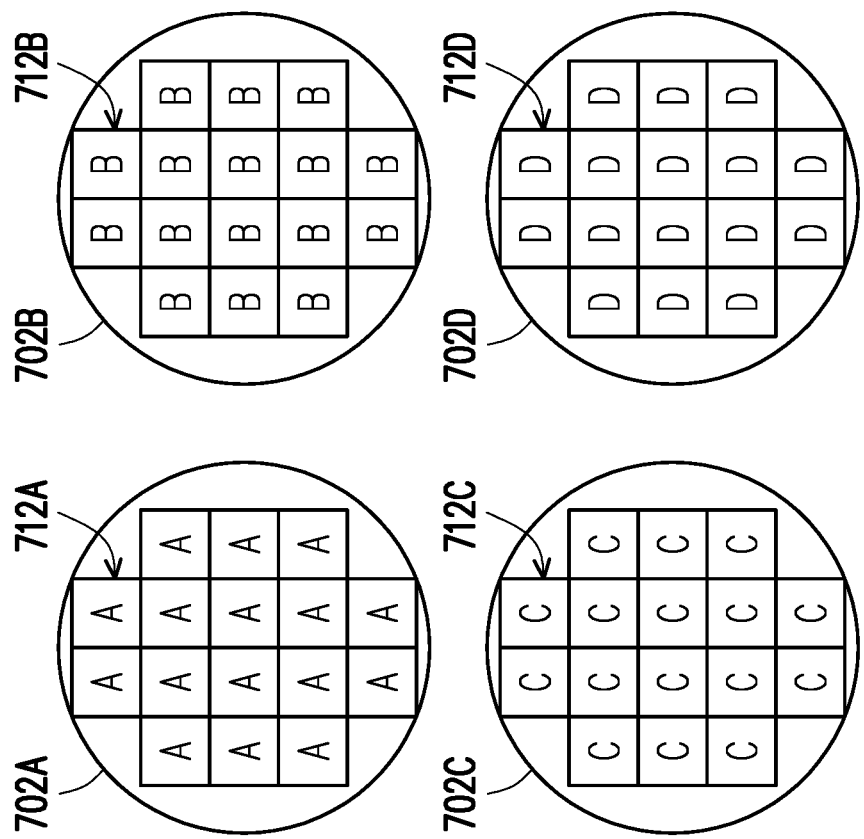
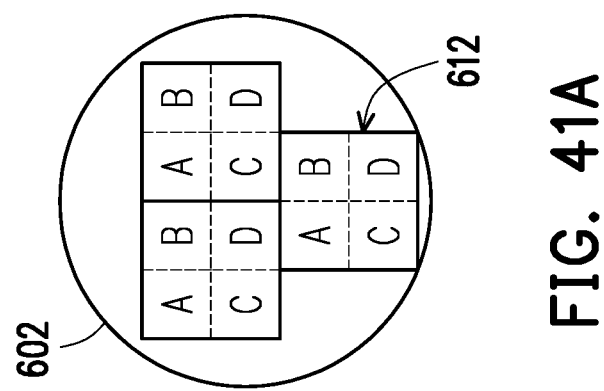
FIG. 41B
FIG. 41A

SEMICONDUCTOR PACKAGE AND METHOD

PRIORITY CLAIM AND CROSS-REFERENCE

This application claims the benefits of U.S. Provisional Application No. 63/127,299, filed on Dec. 18, 2020, which application is hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 9 illustrate cross-sectional views of intermediate steps during a process for forming an interconnect component, in accordance with some embodiments.

FIGS. 31 through 39 illustrate cross-sectional views of intermediate steps during a process for forming a package with multiple interconnect components, in accordance with some embodiments.

FIGS. 41A and 41B illustrate plan views of intermediate steps in the formation of packages, in accordance with some embodiments.

DETAILED DESCRIPTION

Figure 1:
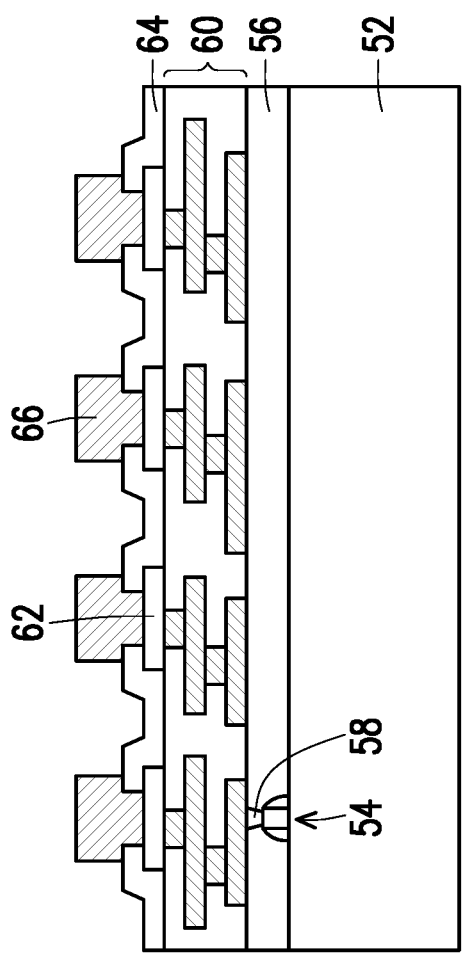
FIG. 1 illustrates a cross-sectional view of an interconnect component, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package having one or more interconnect structures. In some embodiments, the package is a system-on-integrated-substrate (SoIS) package or the like. The package includes two or more interconnect components attached to one or more core substrates. The interconnect components may include electrical routing, through vias, integrated devices such as IPDs or local routing structures, or the like. Semiconductor devices may be attached to the two or more interconnect components. In some cases, by using multiple interconnect components in a package as described herein, yield may be improved and the number of units per wafer may be increased. For example, interconnect structures may have a relatively smaller size that allows more interconnect structures to be formed on a single wafer. Additionally, forming multiple interconnects allows for testing for known good interconnect structures prior to use within a package manufacturing process. In this manner, the cost of forming packages may be reduced. Different types of interconnect structures may be used within the same package, which can allow for design flexibility and performance improvements.

FIG. 1 illustrates a cross-sectional view of an interconnect component 50, in accordance with some embodiments. The interconnect component 50 may be incorporated within an interconnect structure such as the interconnect structure 100 described below for FIG. 9. In some embodiments, the interconnect component 50 is used to form local interconnections within a package, such as the package 200 shown in FIG. 16 or other packages described herein. In some cases, the interconnect component 50 may be considered an integrated device or a local routing structure.

The interconnect component 50 may be formed in a wafer, which may include different device regions that are singulated in subsequent steps to form a plurality of interconnect components 50. The interconnect component 50 may be processed according to applicable manufacturing processes, such as those used to form dies or semiconductor devices. For example, the interconnect component 50 may include a substrate 52, such as silicon, doped or undoped, or an active layer of a semiconductor-on-insulator (SOI) substrate. The substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; the like; or combinations thereof. In some embodiments, the substrate 52 may comprise a ceramic material, a polymer film, a magnetic material, the like, or a combination thereof. Other substrates, such as multi-layered or gradient substrates, may also be used. In some embodiments, the substrate 52 has an active surface (e.g., the surface facing upwards in FIG. 1), sometimes called a front side, and an inactive surface (e.g., the surface facing downwards in FIG. 1), sometimes called a back side.

In some embodiments, the interconnect component 50 may include active or passive devices. In some embodiments, the interconnect component 50 may be free of active or passive devices and may only be used for routing of electrical signals. In the embodiments that include active or passive devices, devices 54 (represented by a transistor in FIG. 1) may be formed at the front surface of the substrate 52. The devices 54 may include active devices (e.g., transistors, diodes, or the like), capacitors, resistors, inductors, the like, or combinations thereof. An inter-layer dielectric (ILD) 56 is over the front surface of the substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 and/or provides electrical routing and connection between die connectors 66. The interconnect structure 60 may comprise, for example, metallization patterns in dielectric layers on the ILD 56. The metallization patterns may include conductive lines and conductive vias formed in one or more low-k dielectric layers. The metallization patterns may be formed using a suitable process, such as a damascene process. In the embodiments in which devices 54 are included, the metallization patterns of the interconnect structure 60 are electrically coupled to the devices 54 by the conductive plugs 58. Although the interconnect structure 60 is illustrated with only two layers of conductive vias and two layers of conductive lines, in other embodiments more or fewer layers of conductive vias or conductive lines may be included.

The interconnect component 50 further includes pads 62, such as aluminum pads, to which external connections are made. The pads 62 are on the active side of the interconnect component 50, such as in and/or on the interconnect structure 60. One or more passivation films 64 are on the interconnect component 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the interconnect component 50.

Optionally, solder regions (e.g., solder balls or solder bumps) may be disposed on the pads 62. The solder balls may be used to perform chip probe (CP) testing on the interconnect component 50. CP testing may be performed on the interconnect component 50 to ascertain whether the interconnect component 50 is a known good die (KGD). Thus, only interconnect components 50 which are KGDs undergo subsequent processing and are packaged, and interconnect components 50 which fail the CP testing are not packaged. After testing, the solder regions may be removed in subsequent processing steps.

In other embodiments, a dielectric layer may be formed on the active side of the interconnect component 50, such as on the passivation films 64 and the die connectors 66. The embodiment shown in FIG. 1 does not include this dielectric layer. The dielectric layer may laterally encapsulate the die connectors 66. The dielectric layer may be a polymer such as PBO, polyimide, BCB, or the like; a nitride such as silicon nitride or the like; an oxide such as silicon oxide, PSG, BSG, BPSG, or the like; the like, or a combination thereof. The dielectric layer may be formed, for example, by spin coating, lamination, chemical vapor deposition (CVD), or the like. In some embodiments, the die connectors 66 are exposed through the dielectric layer during formation of the interconnect component 50. In some embodiments, the die connectors 66 remain buried and are exposed during a subsequent process for packaging the interconnect component 50. Exposing the die connectors 66 may remove any solder regions that may be present on the die connectors 66.

FIGS. 2 through 9 illustrate cross-sectional views of intermediate steps during a process for forming a interconnect structure 100 (see FIG. 9), in accordance with some embodiments. The interconnect structure 100 includes one or more interconnect components 50 (see FIG. 1) and/or one or more integrated passive devices (IPDs) 80 (see FIG. 5). In FIGS. 2 through 8, a first region 101A and a second region 101B are illustrated, and an interconnect structure 100 may be formed in each of the regions 101A and 101B. A singulation process may be performed to singulate individual interconnect structures 100 such as that shown in FIG. 9.

Figure 2:
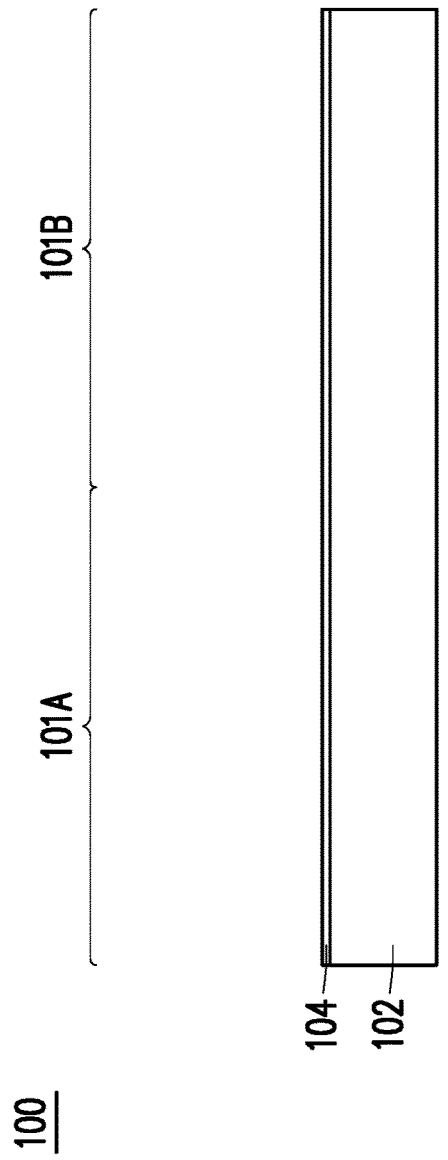

In FIG. 2, a first carrier substrate 102 is provided, and a release layer 104 is formed on the first carrier substrate 102. The first carrier substrate 102 may be a glass carrier substrate, a ceramic carrier substrate, or the like. The first carrier substrate 102 may be a wafer, such that multiple packages can be formed on the first carrier substrate 102 simultaneously. The release layer 104 may be formed of a polymer-based material, which may be removed along with the first carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the first carrier substrate 102, or may be the like. The top surface of the release layer 104 may be leveled and may have a high degree of planarity.

Figure 3:
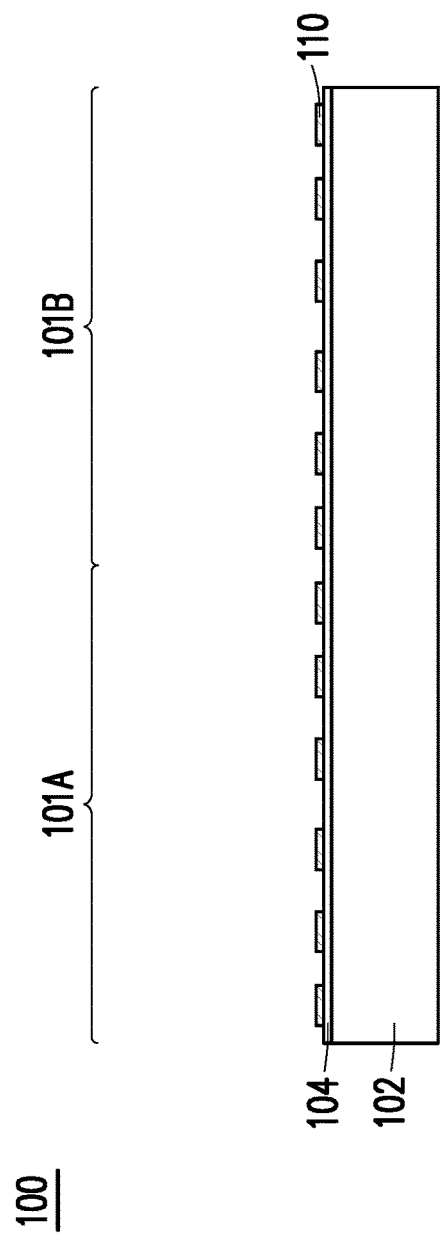

In FIG. 3, conductive lines 110 are formed on the release layer 104. The conductive lines 110 may subsequently be exposed by a carrier de-bonding process (see FIG. 8). As an example to form the conductive lines 110, a seed layer (not shown) is formed over the release layer 104. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive lines 110. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 110. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In FIG. 4, through vias 116 are formed on the conductive lines 110, in accordance with some embodiments. As an example to form the through vias 116, a seed layer (not shown) is formed over the conductive lines 110 and the release layer 104. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the through vias 116. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116. In other embodiments, a seed layer is not used.

In FIG. 5, interconnect components 50 and/or integrated passive devices 80 (IPDs) are attached to the conductive lines 110, in accordance with some embodiments. FIG. 5 illustrates one interconnect component 50 and one IPD 80 attached within each region 101A-B, but in other embodiments, more or fewer interconnect components 50 or IPDs 80 may be attached within each region 101A-B. The interconnect components 50 may be similar to the interconnect component 50 described for FIG. 1. The IPDs 80 may be, for example, a device comprising one or more passive devices such as capacitors, resistors, inductors, or the like. In some embodiments, other types components such as an integrated voltage regulator (IVR) or the like may be incorporated within an interconnect structure 100. In this manner, an interconnect structure 100 can be formed comprising various components such as interconnect components 50 and/or IPDs 80, which can provide desired functionality and performance benefits. In some cases, incorporating interconnect components 50 or IPDs 80 within an interconnect structure 100 can reduce the chance of joint failure for the interconnect components 50 or IPDs 80 compared with attaching the interconnect components 50 and/or IPDs 80 to other features of the package.

In some embodiments, the interconnect components 50 or IPDs 80 may be attached using conductive connectors 114. The conductive connectors 114 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may include a conductive material such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once a layer of solder has been formed on the structure, a reflow may be performed in order to shape the material into the desired bump shapes. The conductive connectors 114 may be formed on the die connectors 66 of the interconnect components 50, on die connectors of the IPDs 80, and/or on the conductive lines 110.

In an embodiment, the interconnect components 50 and IPDs 80 are placed into physical contact with the conductive lines 110 using, e.g., a pick-and-place process. The interconnect components 50 and IPDs 80 may be placed such that regions of the conductive lines 110 are aligned with corresponding conductive connectors 114 of the interconnect components 50 and IPDs 80. In some embodiments, once the conductive connectors 114 is in physical contact with the conductive lines 110, a reflow process may be performed to bond the conductive connectors 114 to the conductive lines 110 and thus attach the interconnect components 50 and IPDs 80 to the conductive liens 110. In other embodiments, other bonding techniques such as direct bonding, hybrid bonding, or the like may be used to attach the interconnect components 50 and IPDs 80 to the conductive lines 110.

Figure 6:
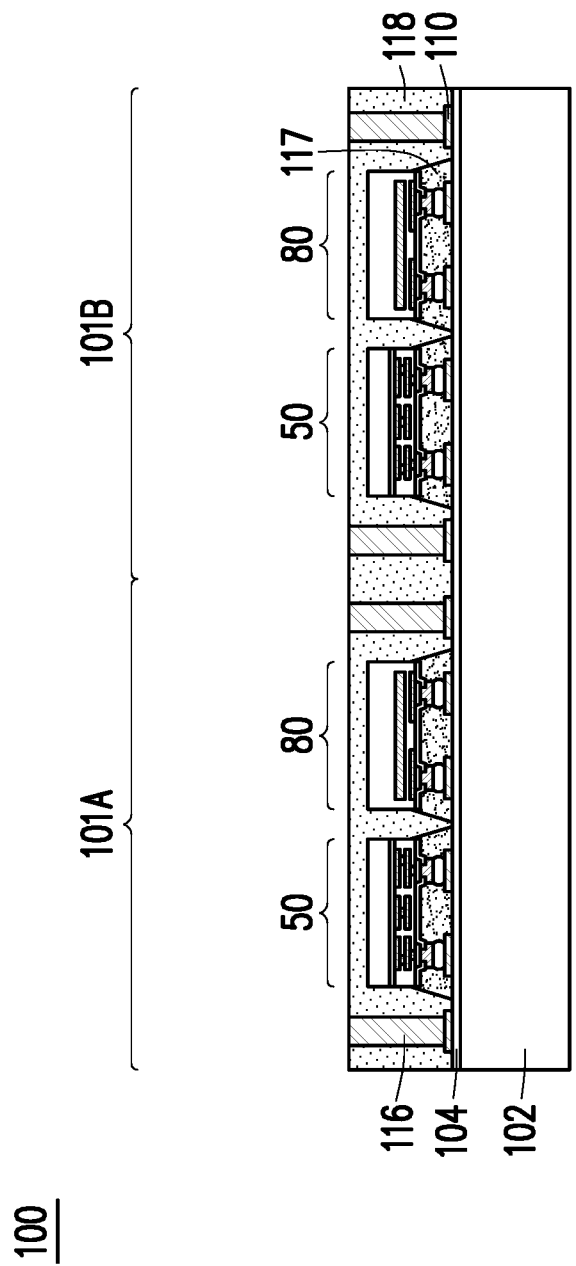

In FIG. 6, an encapsulant 118 is formed on and around various components. The encapsulant 118 encapsulates the through vias 116, the interconnect components 50, and the IPDs 80. The encapsulant 118 may be a molding compound, epoxy, or the like. The encapsulant 118 may be applied by compression molding, transfer molding, or the like, and may be formed over the first carrier substrate 102 such that the through vias 116, the interconnect components 50, and/or the IPDs 80 are buried or covered. The encapsulant 118 may be applied in liquid or semi-liquid form and then subsequently cured.

In some embodiments, an underfill 117 is formed prior to encapsulating with the encapsulant 118. The underfill 117 may surround the conductive connectors 114 of the interconnect components 50 or the IPDs 80. The underfill 117 may reduce stress and protect the joints resulting from the reflowing of the conductive connectors 114. The underfill 117 may be formed by a capillary flow process after the interconnect components 50 or the IPDs 80 are attached, and may be formed by a suitable deposition method. In some embodiments, a single layer of underfill 117 is formed beneath multiple adjacent devices.

In some embodiments, a planarization process is performed on the encapsulant 118 to expose the through vias 116. In some embodiments, surfaces of one or more interconnect components 50 or IPDs 80 are also exposed by the planarization process. The planarization process may also remove material of the through vias 116. Top surfaces of the through vias 116 and the encapsulant 118 are substantially coplanar after the planarization process, within process variations. The planarization process may be, for example, a chemical-mechanical polish (CMP), a grinding process, or the like. In some embodiments, the planarization may be omitted, for example, if the through vias 116 are already exposed.

Figure 7:
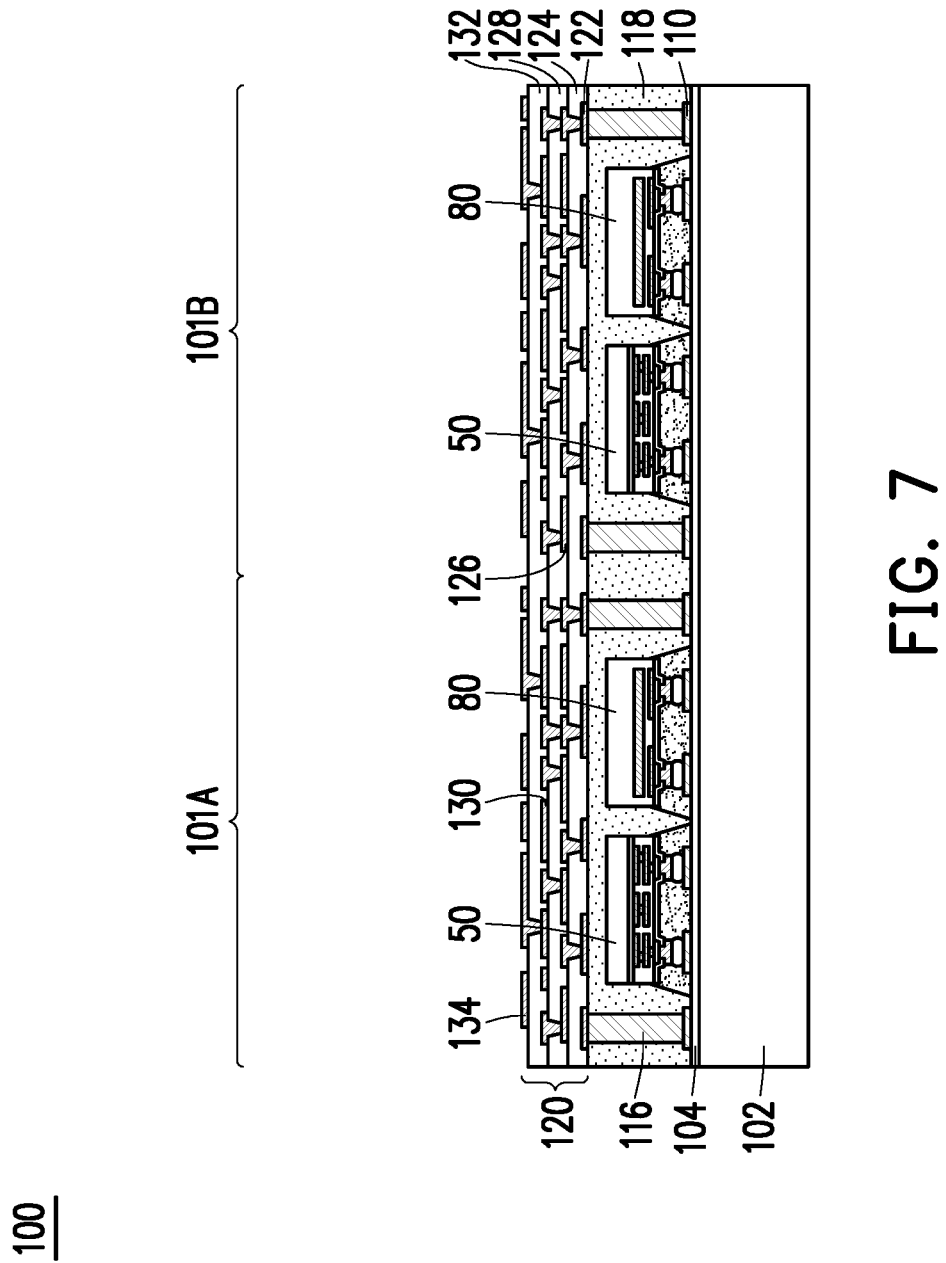

In FIG. 7, a redistribution structure 120 is formed over the encapsulant 118 and the through vias 116, in accordance with some embodiments. The redistribution structure 120 includes dielectric layers 124, 128, and 132; and metallization patterns 122, 126, 130, and 134. The metallization patterns may also be referred to as redistribution layers or redistribution lines. The redistribution structure 120 is shown as an example having four layers of metallization patterns. More or fewer dielectric layers and metallization patterns may be formed in the redistribution structure 120. If fewer dielectric layers and metallization patterns are to be formed, steps and process discussed below may be omitted. If more dielectric layers and metallization patterns are to be formed, steps and processes discussed below may be repeated.

As an example of forming the redistribution structure 120, a metallization pattern 122 is formed over the encapsulant 118 and through vias 116. The metallization pattern 122 includes conductive elements extending along the major surface of the encapsulant 118 and on through vias 116 to physically and electrically couple to the through vias 116. As an example to form the metallization pattern 122, a seed layer is formed over the encapsulant 118 and through vias 116. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 122. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 122. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. In other embodiments, a metallization pattern 122 is not formed on the encapsulant 118 and through vias 116 prior to forming the dielectric layer 124.

The dielectric layer 124 is deposited on the encapsulant 118 and the metallization pattern 122. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the metallization pattern 122. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes portions on and extending along the major surface of the dielectric layer 124. The metallization pattern 126 further includes portions extending through the dielectric layer 124 to physically and electrically couple the metallization pattern 122. The metallization pattern 126 may be formed in a similar manner and of a similar material as the metallization pattern 122. In some embodiments, the metallization pattern 126 has a different size than the metallization pattern 122. For example, the conductive lines of the metallization pattern 126 may be wider or thicker than the conductive lines of the metallization pattern 122. Further, the metallization pattern 126 may be formed to a greater pitch than the metallization pattern 122.

The dielectric layer 128 is then deposited on the metallization pattern 126 and dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 122. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

The dielectric layer 132 is then deposited on the metallization pattern 130 and dielectric layer 128. The dielectric layer 132 may be formed in a manner similar to the dielectric layer 124, and may be formed of a similar material as the dielectric layer 124. The dielectric layer 132 is the topmost dielectric layer of the redistribution structure 120. For example, all of the intermediate dielectric layers of the redistribution structure 120 (e.g., the dielectric layers 124 and 128) are disposed between the dielectric layer 132 and the encapsulant 118.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 122. The metallization pattern 134 is the topmost metallization pattern of the redistribution structure 120. As such, all of the intermediate metallization patterns of the redistribution structure 120 (e.g., the metallization patterns 126 and 130) are disposed between the metallization pattern 134 and the encapsulant 118. In some embodiments, the metallization pattern 134 has a different size than the metallization patterns 122, 126, and 130. For example, the conductive lines and/or vias of the metallization pattern 134 may be wider or thicker than the conductive lines and/or vias of the metallization patterns 122, 126, and 130. Further, the metallization pattern 134 may be formed to a greater pitch than the metallization pattern 130.

Figure 8:
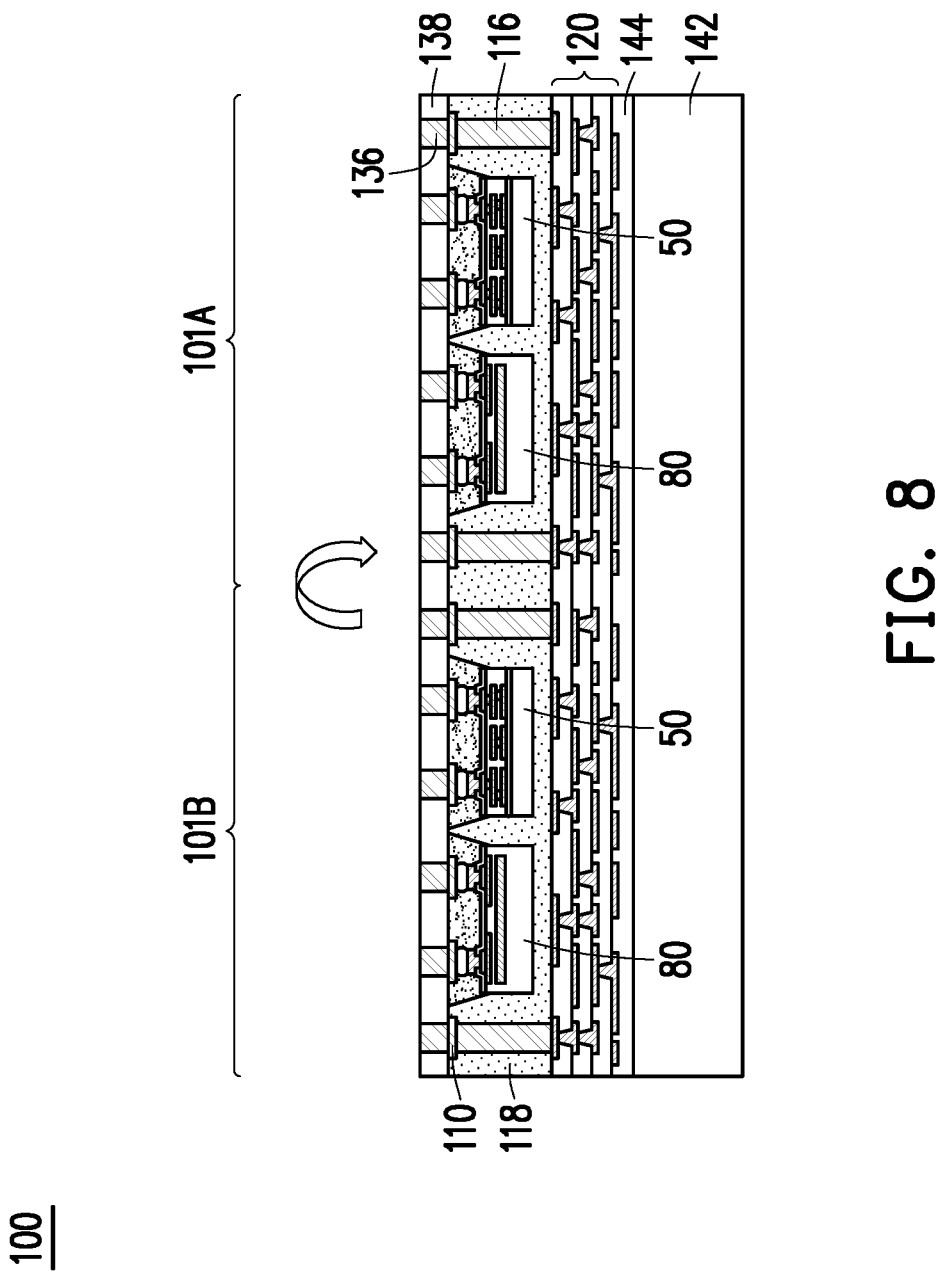

In FIG. 8, the structure is de-bonded and conductive vias 136 are formed, in accordance with some embodiments. The de-bonding is performed to detach (or "de-bond") the first carrier substrate 102 from the structure. In accordance with some embodiments, the de-bonding includes projecting a light such as a laser light or an UV light on the release layer 104 so that the release layer 104 decomposes under the heat of the light and the first carrier substrate 102 can be removed. The structure is then flipped over and attached to a second carrier substrate 142. The second carrier substrate 142 may be similar to the first carrier substrate 102 or may be, for example, a tape. A release layer 144 may be formed on the second carrier substrate 142 to facilitate attachment of the structure to the second carrier substrate 142. The release layer 144 may be similar to the release layer 104 or may be, for example, an adhesive layer.

After attachment to the second carrier substrate 142, conductive vias 136 may be formed on the conductive lines 110, in accordance with some embodiments. The conductive vias 136 are electrically connected to the through vias 116, the interconnect components 50, and the IPDs 80. In some embodiments, the conductive vias 136 may comprise under-bump metallurgies (UBMs). As an example to form the conductive vias 136, a seed layer (not shown) is formed over the encapsulant 118 and the conductive lines 110. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive vias 136. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 136. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

A dielectric layer 138 is formed on and around the conductive vias 136, in accordance with some embodiments. After formation, the dielectric layer 138 surrounds the conductive vias 136. The dielectric layer 138 may provide electrical isolation and environmental protection. The dielectric layer 138 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; an encapsulant, molding compound, epoxy, or the like; or a combination thereof. The dielectric layer 138 may be formed, for example, by spin coating, lamination, chemical vapor deposition (CVD), or the like. After forming the dielectric layer 138, a planarization process (e.g., a CMP or grinding process) may be performed to expose the conductive vias 136, in some embodiments.

In other embodiments, the dielectric layer 138 may be formed before the conductive vias 136. In such embodiments, openings are formed through the dielectric layer 138 to expose portions of the conductive lines 110. The openings may be formed, for example, using laser drilling, etching, or the like. The conductive vias 136 are then formed in the openings to make physical and electrical contact with the conductive lines 110. After forming the conductive vias 136, a planarization process (e.g., a CMP or grinding process) may be performed, in some embodiments.

Figure 9:
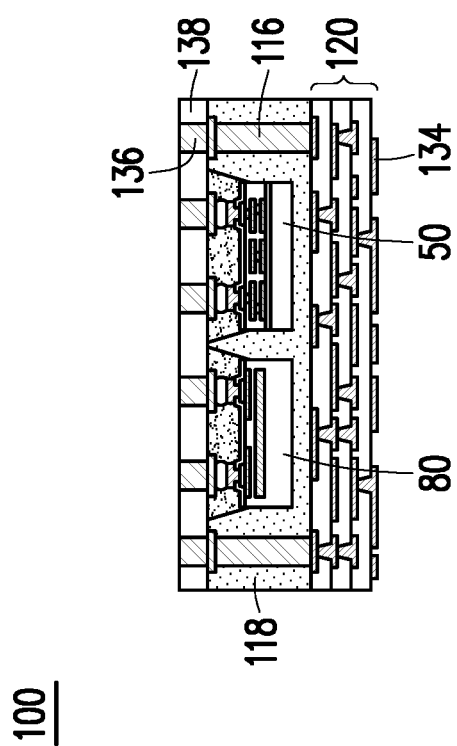

In FIG. 9, the structure is de-bonded from the second carrier substrate 142 and singulated to form individual interconnect structures 100, in accordance with some embodiments. FIG. 9 illustrates an interconnect structure 100 after singulation, in accordance with some embodiments. The singulation process is performed by sawing along scribe line regions, e.g., between the first region 101A and the second package region 101B shown in FIGS. 2-8. The sawing singulates the first region 101A from adjacent regions (e.g., the second region 101B) to form multiple singulated interconnect structures 100. As shown in FIG. 9, an interconnect structure 100 may have conductive vias 136 and a metallization pattern 134 that allow for subsequent electrical connections to be made to the interconnect structure 100.

FIGS. 10 through 16 illustrate the formation of a package 200 (see FIG. 16) including multiple interconnect structures 100A-B, in accordance with some embodiments. The interconnect structures 100A-B of the package 200 may be similar to the interconnect structure 100 shown in FIG. 9. By using multiple interconnect structures 100 within a package 200 instead of a single, larger interconnect structure, the manufacturing cost may be reduced and the yield may be improved. Some advantages of using multiple interconnect structures 100 in a package are described in greater detail below for FIGS. 40A-42B. A package 200 may include a different number of interconnect structures 100 than shown, and the interconnect structures 100 within a package 200 may be similar or different.

Figure 10:
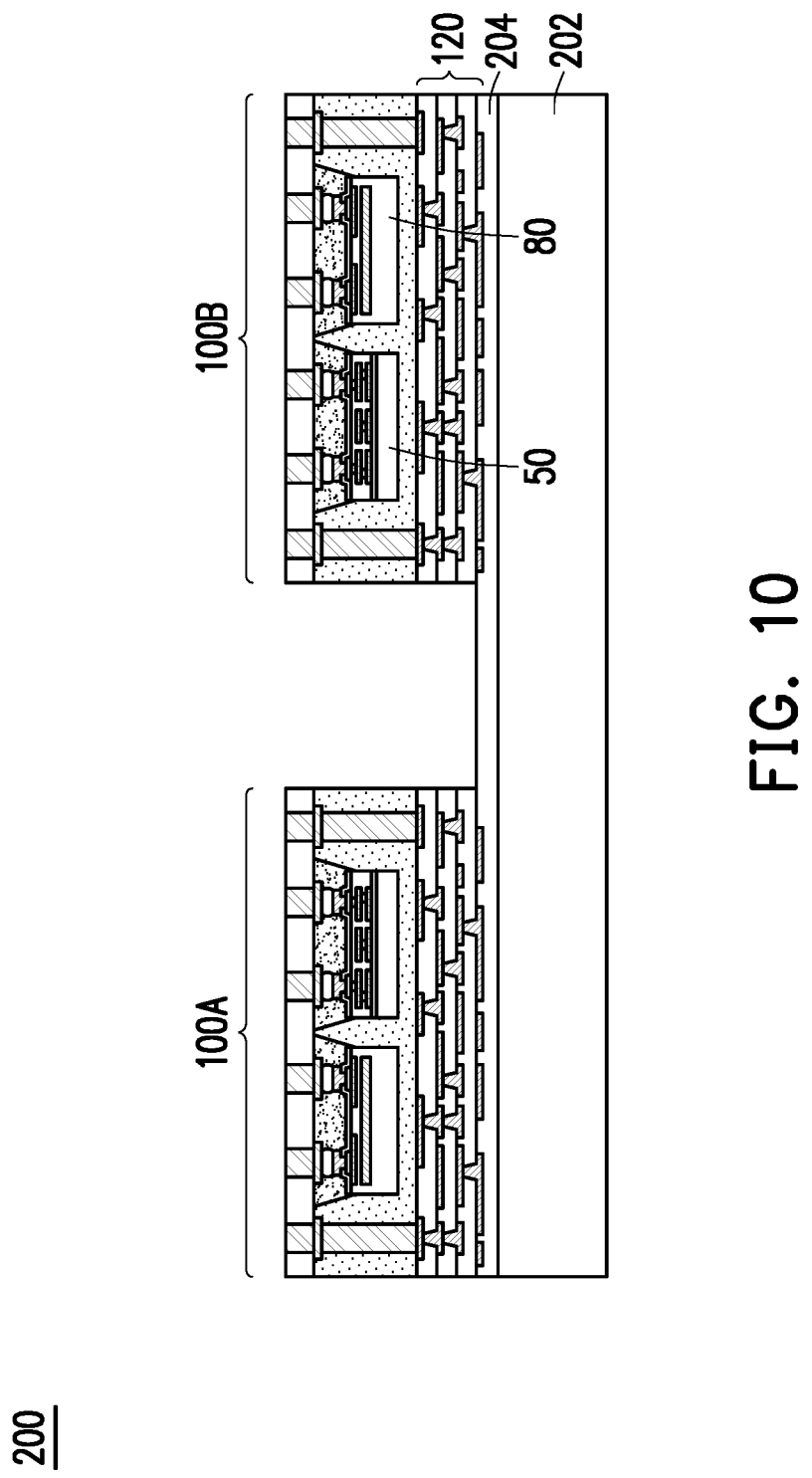
FIGS. 10 through 16 illustrate cross-sectional views of intermediate steps during a process for forming a package with multiple interconnect components, in accordance with some embodiments.

FIG. 10 illustrates the placement of interconnect structures 100A-B on a carrier substrate 202, in accordance with some embodiments. The carrier substrate 202 may be similar to the first carrier substrate 102 described previously. As shown in FIG. 10, the interconnect structures 100A-B may be placed such that redistribution structure 120 of each interconnect structure 100A-B faces the carrier substrate 202. The interconnect structures 100A-B may be attached to the carrier substrate 202 using, for example, an adhesive layer 204. The adhesive layer 204 may be similar to the release layer 104 described previously, in some embodiments. FIG. 10 shows the placement of two interconnect structures 100A-B, but more than two interconnect structures may be placed in other embodiments.

Figure 11:
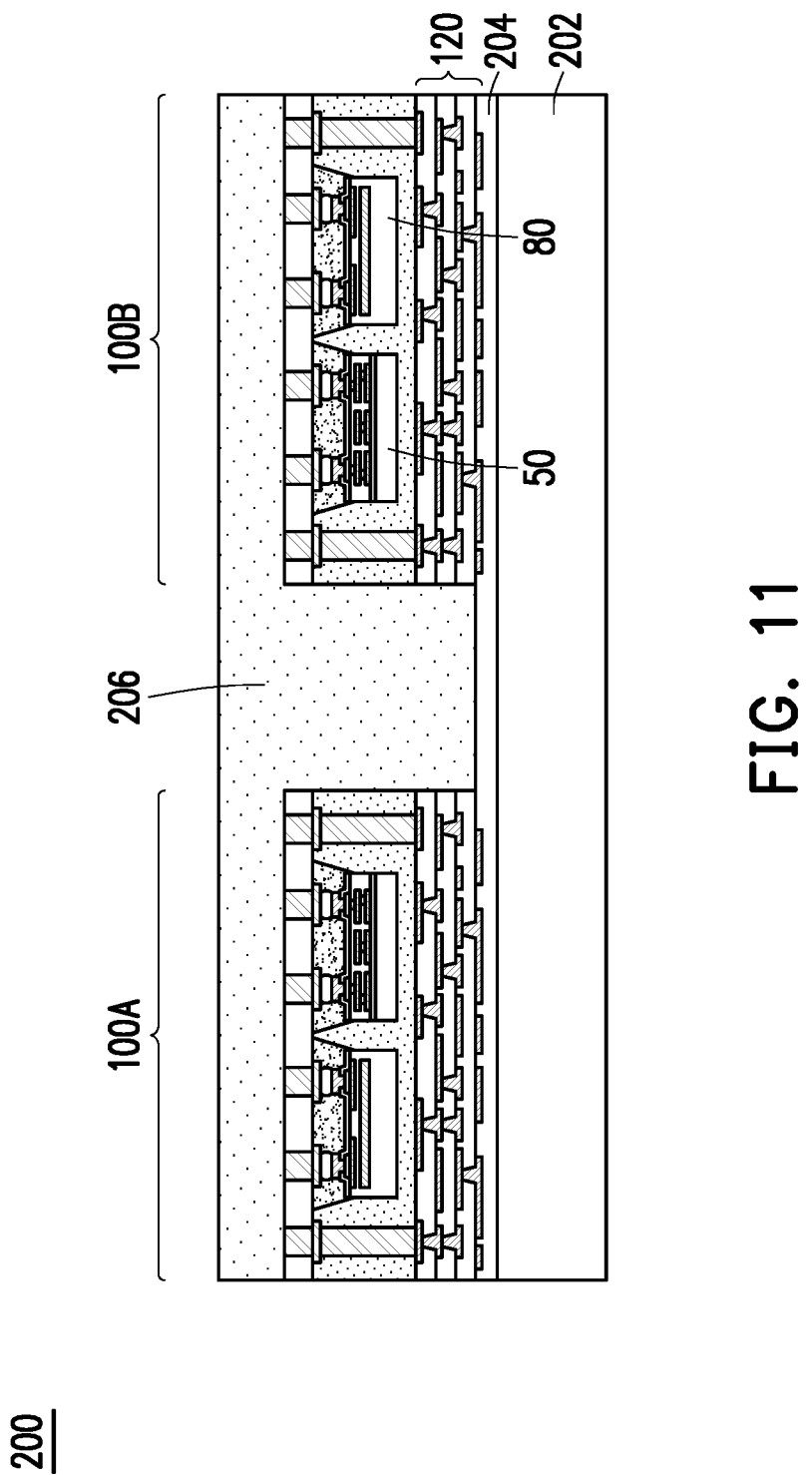

In FIG. 11, an encapsulant 206 is formed on the interconnect structures 100A-B, in accordance with some embodiments. The encapsulant 206 may be a molding compound, epoxy, or the like, and may be similar to the encapsulant 118 described previously. The encapsulant 206 may be applied by compression molding, transfer molding, or the like, and may be formed over the carrier substrate 202 such that the interconnect structures 100A-B are buried or covered. The encapsulant 206 may be applied in liquid or semi-liquid form and then subsequently cured.

Figure 12:
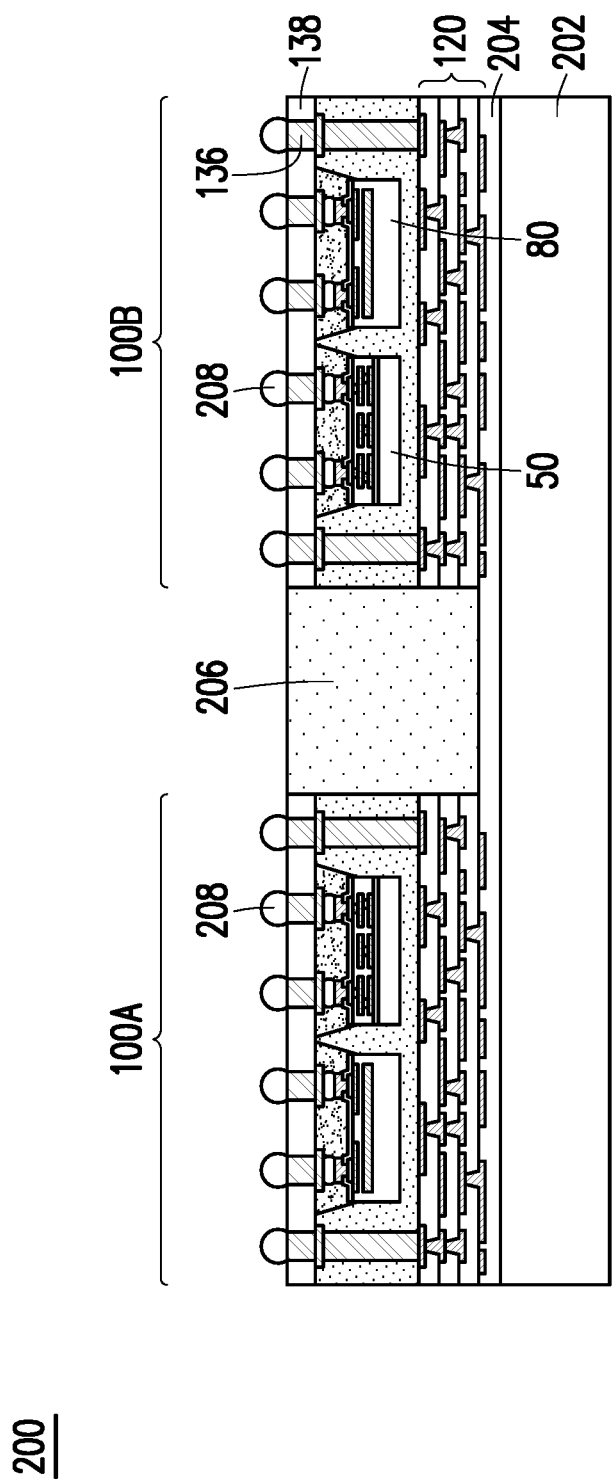

In FIG. 12, a planarization process is performed to remove excess encapsulant 206, and conductive connectors 208 are formed, in accordance with some embodiments. The planarization process may remove encapsulant 206 such that the conductive vias 136 and the dielectric layer 138 of each interconnect structure 100A-B are exposed. After performing the planarization process, surfaces of the encapsulant 206 and the interconnect structures 100A-B may be coplanar. The planarization process may comprise a CMP process, a grinding process, and etching process, the like, or a combination thereof.

Still referring to FIG. 12, conductive connectors 208 are formed on the conductive vias 136. The conductive connectors 208 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 208 may include a conductive material such as solder, copper, aluminum, gold, nickel, silver, palladium, tin, the like, or a combination thereof. In some embodiments, the conductive connectors 208 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 208 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
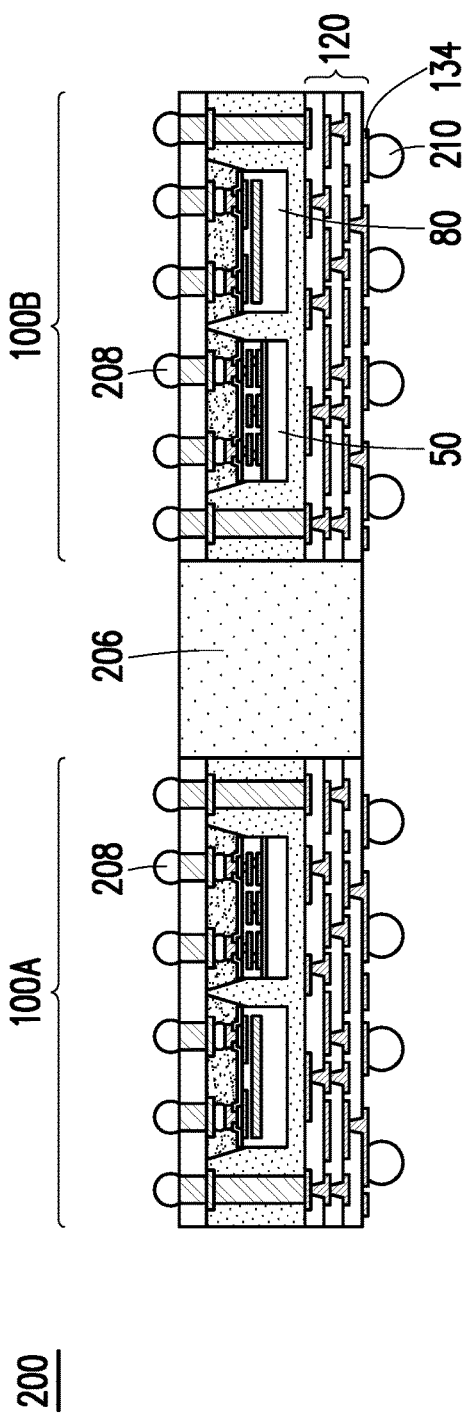

In FIG. 13, the structure is de-bonded from the carrier substrate 202, and conductive connectors 210 are formed on the interconnect structures 100A-B, in accordance with some embodiments. The previously deposited encapsulant 206 secures the multiple interconnect structures 100A-B, forming a substantially rigid structure comprising the multiple interconnect structures 100A-B, which may be referred to herein as a "connection structure." The conductive connectors 210 may be formed on the metallization pattern 134 of the redistribution structure 120 of each interconnect structure 100A-B. In some embodiments, the conductive connectors 210 comprise flux and are formed in a flux dipping process. In some embodiments, the conductive connectors 210 comprise a conductive paste such as solder paste, silver paste, or the like, and are dispensed in a printing process. In some embodiments, the conductive connectors 210 are formed in a manner similar to the conductive connectors 208, and may be formed of a similar material as the conductive connectors 208.

Figure 14:
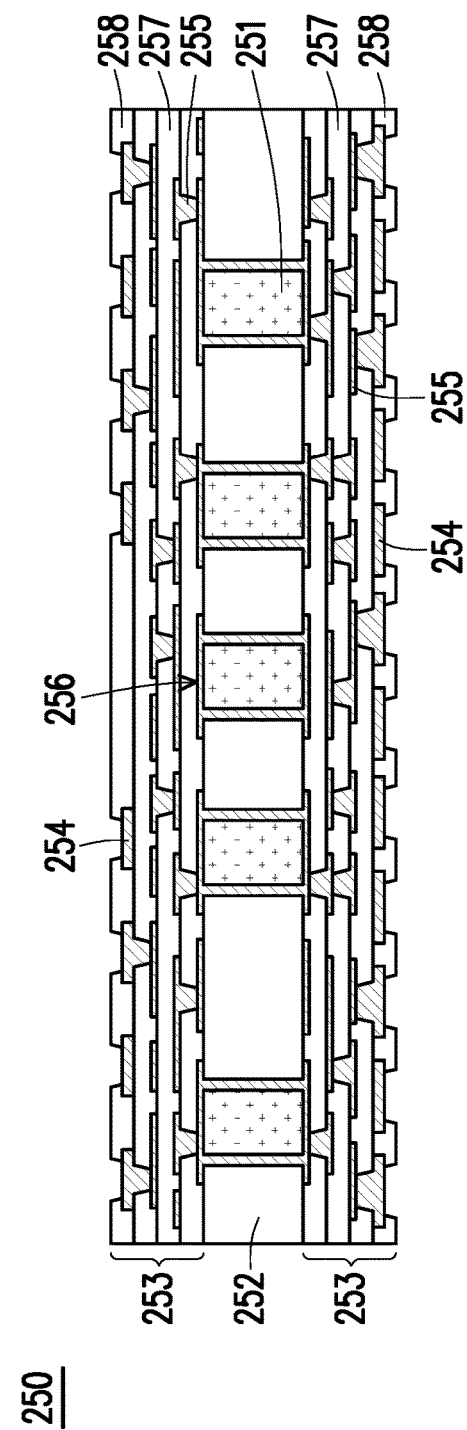

Turning to FIG. 14, a core substrate 250 is illustrated, in accordance with some embodiments. The core substrate 250 is subsequently bonded to the conductive connectors 210 (see FIG. 15) of the connection structure. Utilizing the core substrate 250 has the advantage of the core substrate 250 being manufactured in a separate process, which allows for separate testing so that a known good core substrate 250 may be used. For example, in some embodiments, the core substrate 250 may be individually or batch tested, validated, and/or verified prior to bonding the core substrate 250 to the conductive connectors 210. The core substrate 250 may include active and passive devices (not shown), or may be free from either active devices, passive devices, or both. A wide variety of devices such as transistors, capacitors, resistors, inductors, combinations of these, and the like may be used. The devices may be formed using any suitable methods.

The core substrate 250 may be processed according to applicable manufacturing processes to form redistribution structures in the core substrate 250. For example, the core substrate 250 includes a core material 252. The core material 252 comprise one or more layers of glass fiber, resin, filler, pre-preg, epoxy, silica filler, Ajinomoto Build-up Film (ABF), polyimide, molding compound, other materials, and/or combinations thereof. The core material 252 may be formed of organic materials and/or inorganic materials. In some embodiments, for example, the core material 252 may include two or more layers of material. In some embodiments, the core material 252 includes one or more passive components (not shown) embedded inside. The core material 252 may comprise other materials or components.

Conductive vias 256 are formed extending through the core material 252. The conductive vias 256 may comprise a conductive material such as copper, a copper alloy, or other conductors, and may include a barrier layer (not shown), liner (not shown), seed layer (not shown), and/or a fill material 251, in some embodiments. The conductive vias 256 provide vertical electrical connections from one side of the core material 252 to the other side of the core material 252. For example, some of the conductive vias 256 are coupled between conductive features on one side of the core material 252 and conductive features on an opposite side of the core material 252. In some embodiments, openings for the conductive vias 256 may be formed in the core material 252 using a drilling process, photolithography, a laser process, or another suitable technique. The openings for the conductive vias 256 are then filled or plated with conductive material. In some embodiments, the conductive vias 256 are hollow through vias having centers that are filled with an insulating fill material 251.

Redistribution structures 253 are formed on opposing sides of the core material 252. The redistribution structures 253 are electrically coupled by the conductive vias 256. The redistribution structures 253 each include dielectric layers 257, formed of ABF, pre-preg, or the like, and metallization patterns 255. Each respective metallization pattern 255 has line portions on and extending along a major surface of a respective dielectric layer 257, and has via portions extending through the respective dielectric layer 257. The redistribution structures 253 each may include under-bump metallurgies (UBMs) 254 for external connection, and solder resists 258 protecting the features of the redistribution structures 253. Each redistribution structure 253 of the core substrate 250 may have more or fewer dielectric layers 257 and metallization patterns 255 than shown in FIG. 14.

Figure 15:
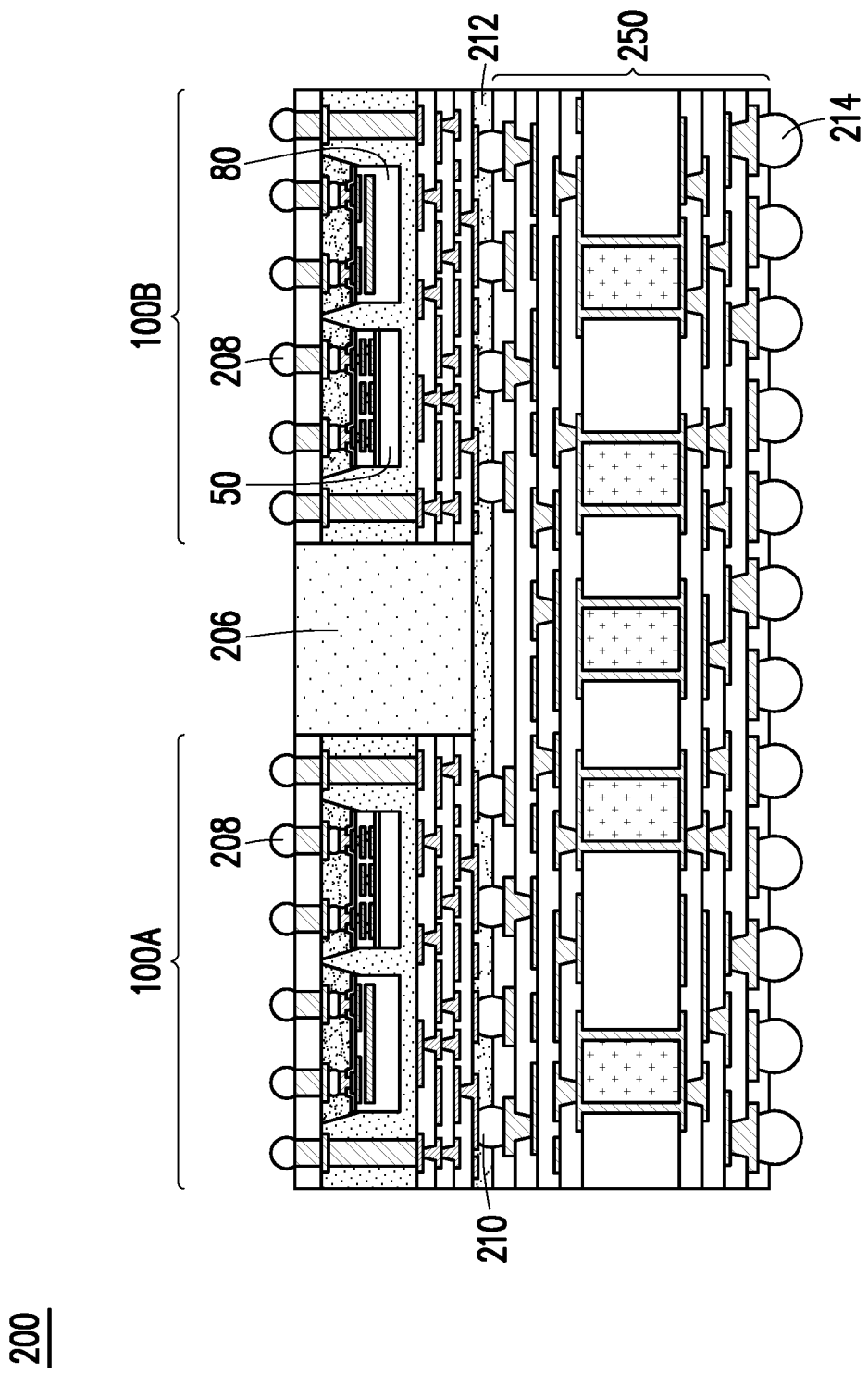

Turning to FIG. 15, a core substrate 250 is attached to the interconnect structures 100A-B, in accordance with some embodiments. The core substrate 250 may be similar to the core substrate 250 shown in FIG. 14. Attaching the core substrate 250 may include placing the structure of FIG. 13 on the core substrate 250 such that the conductive connectors 210 physically contact the UBMs 254 of one side of the core substrate 250. A reflowing process may then be performed on the conductive connectors 210 to physically and electrically couple the core substrate 250 and the interconnect structures 100A-B.

In some embodiments, an underfill 212 may be formed between the interconnect structures 100A-B and the core substrate 250 and surrounding the conductive connectors 210. The underfill 212 may be formed by a capillary flow process after the core substrate 250 is attached or may be formed by a suitable deposition method before the core substrate 250 is attached. The underfill 212 may be a molding compound, epoxy, underfill, molding underfill (MUF), resin or the like, and may be similar to the encapsulant 206 or the encapsulant 118 described previously.

Conductive connectors 214 may be formed on the core substrate 250, in some embodiments. The conductive connectors 214 may be formed on UBMs 254 of the core substrate 250, for example. The conductive connectors 214 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 214 may include a conductive material such as solder, copper, aluminum, gold, nickel, silver, palladium, tin, the like, or a combination thereof. In some embodiments, the conductive connectors 214 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 214 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
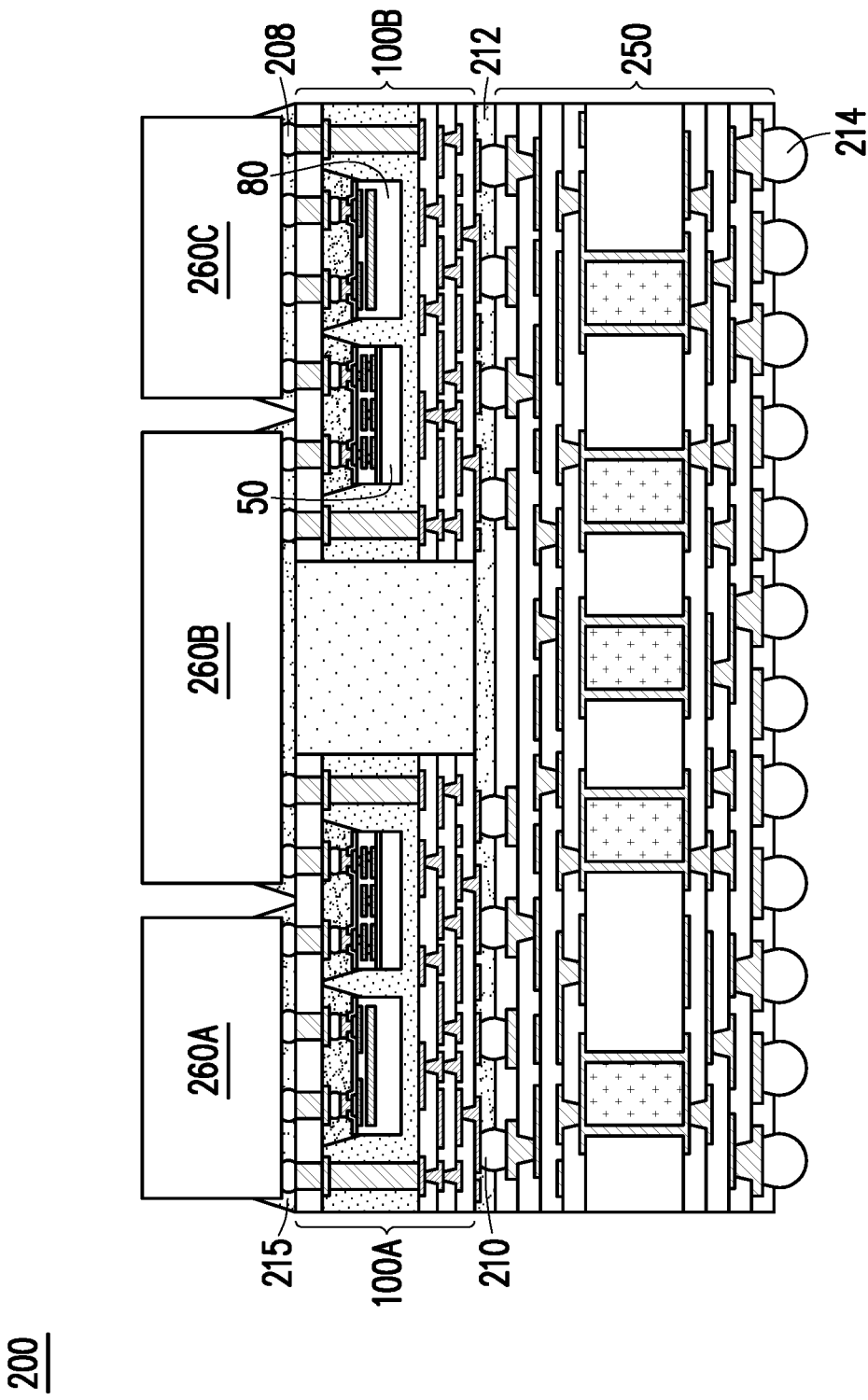

FIG. 16 illustrates the attachment of semiconductor devices 260A-C to form a package 200, in accordance with some embodiments. The semiconductor devices 260A-C are physically and electrically connected to the conductive connectors 208 to make electrical connection between the semiconductor devices 260A-C and the interconnect structures 100A-B.

FIG. 16 shows the attachment of three semiconductor devices 260A-C, but in other embodiments, one, two, or more than three semiconductor devices 260 may be attached to the conductive connectors 208. In some embodiments, the semiconductor devices 260 attached to the conductive connectors 208 may include more than one of the same type of semiconductor device 260 or may include two or more different types of semiconductor devices 260. The semiconductor devices 260A-C may be attached in a different arrangement or configuration than shown. For example, FIG. 16 shows one semiconductor device 260B electrically connected to both the interconnect structure 100A and the interconnect structure 100B, but in other embodiments each semiconductor device 260 may be electrically connected to a single interconnect structure 100.

The semiconductor devices 260A-C may be placed on the conductive connectors 208 using a suitable process such as a pick-and-place process. The semiconductor devices 260A-C may be placed such that conductive regions of the semiconductor devices 260A-C (e.g., contact pads, conductive connectors, solder bumps, or the like) are aligned with corresponding conductive connectors 208 on the interconnect structure 100A-B. Once in physical contact, a reflow process may be utilized to bond the conductive connectors 208 to the semiconductor devices 260A-C, forming the package 200. The process shown in FIGS. 10 through 16 is a "chip-last" process in which the semiconductor devices 260A-C are attached after the core substrate 250 is attached. In other embodiments, the semiconductor devices 260A-C may be attached before the core substrate 250 is attached.

As shown in FIG. 16, an underfill 215 may be deposited between the semiconductor devices 260A-C and the interconnect structures 100A-B. The underfill 215 may also at least partially surround the conductive connectors 208. The underfill 215 may be a material such as a molding compound, an epoxy, an underfill, a molding underfill (MUF), a resin, or the like, and may be similar to the underfill 117 or the encapsulant 118 described previously. In some embodiments, a sidewall of an interconnect structure 100, a sidewall of the underfill 212, and a sidewall of the core substrate 250 may be approximately coplanar. In other embodiments, two of the sidewalls of an interconnect structure 100, the underfill 212, and the core substrate 250 may be approximately coplanar, or none of the sidewalls may be approximately coplanar.

As shown in FIG. 16, one or more of the semiconductor devices 260A-C are electrically connected to an interconnect component 50 of an interconnect structure 100. In some cases, two or more semiconductor devices 260A-C may be at least partially connected to each other by an interconnect component 50. By forming the interconnect component 50 in a layer of the interconnect structure 100 that is close to the semiconductor devices 260A-C as described herein, the routing distances of connections between the semiconductor devices 260A-C may be reduced, which can increase the bandwidth or speed of electrical signals communicated between the semiconductor devices 260A-C, improving high-speed operation. In this manner, the interconnect components 50 can increase the communication bandwidth between the semiconductor devices 260A-C while maintaining low contact resistance and high reliability. Additionally, the greater routing density available in the interconnect components 50 can provide more efficient routing between semiconductor devices 260A-C, and in some cases can reduce the number of metallization patterns used in the interconnect structures 100A-B or the number of metallization patterns used in the core substrate 250. In some cases, forming an interconnect structure 100 with an IPD 80 can reduce the routing distance of connections between a semiconductor device 260 and that IPD 80, which can improve high-speed operation.

Each of the semiconductor devices 260A-C may include one or more an integrated fan-out (InFO) structures, semiconductor packages, integrated circuit dies, such as a logic die (e.g., central processing unit (CPU), graphics processing unit (GPU), system-on-a-chip (SoC), component-on-a-wafer (CoW), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an input-output (I/O) die, the like, or combinations thereof. The integrated circuit dies may include a memory device such as a hybrid memory cube (HMC) module, a high bandwidth memory (HBM) module, or the like that includes multiple memory dies. In some embodiments, one or more of the semiconductor devices 260A-C includes integrated circuit devices, such as transistors, capacitors, inductors, resistors, metallization layers, external connectors, and the like, therein, as desired for a particular functionality.

FIGS. 17 through 21 illustrate the formation of a package 300 (see FIG. 21) including multiple interconnect structures 100A-B and multiple core substrates 250A-B, in accordance with some embodiments. The interconnect structures 100A-B of the package 300 may be similar to the interconnect structures 100A-B shown in FIG. 9. The core substrates 250A-B of the package 300 may be similar to the core substrate 250 shown in FIG. 14, except that the core substrates 250A-B may have relatively smaller dimensions than the core substrate 250 shown in FIG. 14. As such, the package 300 may be similar to the package 200 shown in FIG. 16 except for the use of multiple core substrates 250A-B instead of a single core substrate 250. By using multiple core substrates 250A-B within a package 300 instead of a single, larger core substrate 250, the manufacturing cost may be reduced and the yield may be improved. A package 300 may include a different number or configuration of interconnect structures 100 or core substrates 250 than shown.

Figure 17:
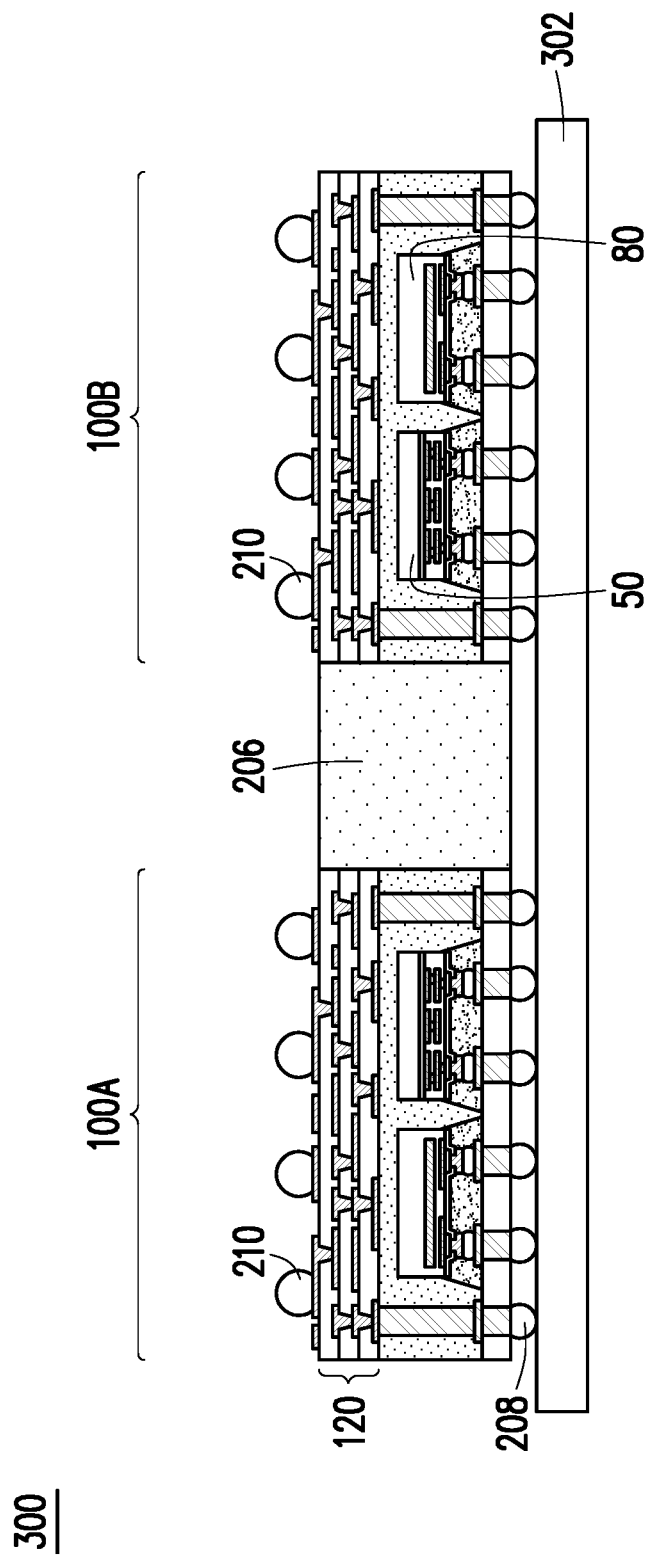
FIGS. 17 through 21 illustrate cross-sectional views of intermediate steps during a process for forming a package with multiple interconnect components and multiple core substrates, in accordance with some embodiments.

In FIG. 17, a structure is shown that includes multiple interconnect structures 100A-B, in accordance with some embodiments. The structure shown in FIG. 17 is similar to the connection structure shown previously in FIG. 13, except that the structure of FIG. 17 has been attached to a carrier 302. For example, the structure shown in FIG. 17 includes multiple interconnect structures 100A-B that are secured by an encapsulant 206, which may be similar to the encapsulant 206 described previously. Conductive connectors 208 and conductive connectors 210 have been formed on the interconnect structures 100A-B, which may be similar to the conductive connectors 208 and conductive connectors 210 described previously. The structure shown in FIG. 17 may be formed in a manner similar to that described for the structure shown in FIG. 13. The carrier 302 may be similar to the first carrier substrate 102 or may be, for example, a tape.

Figure 18:
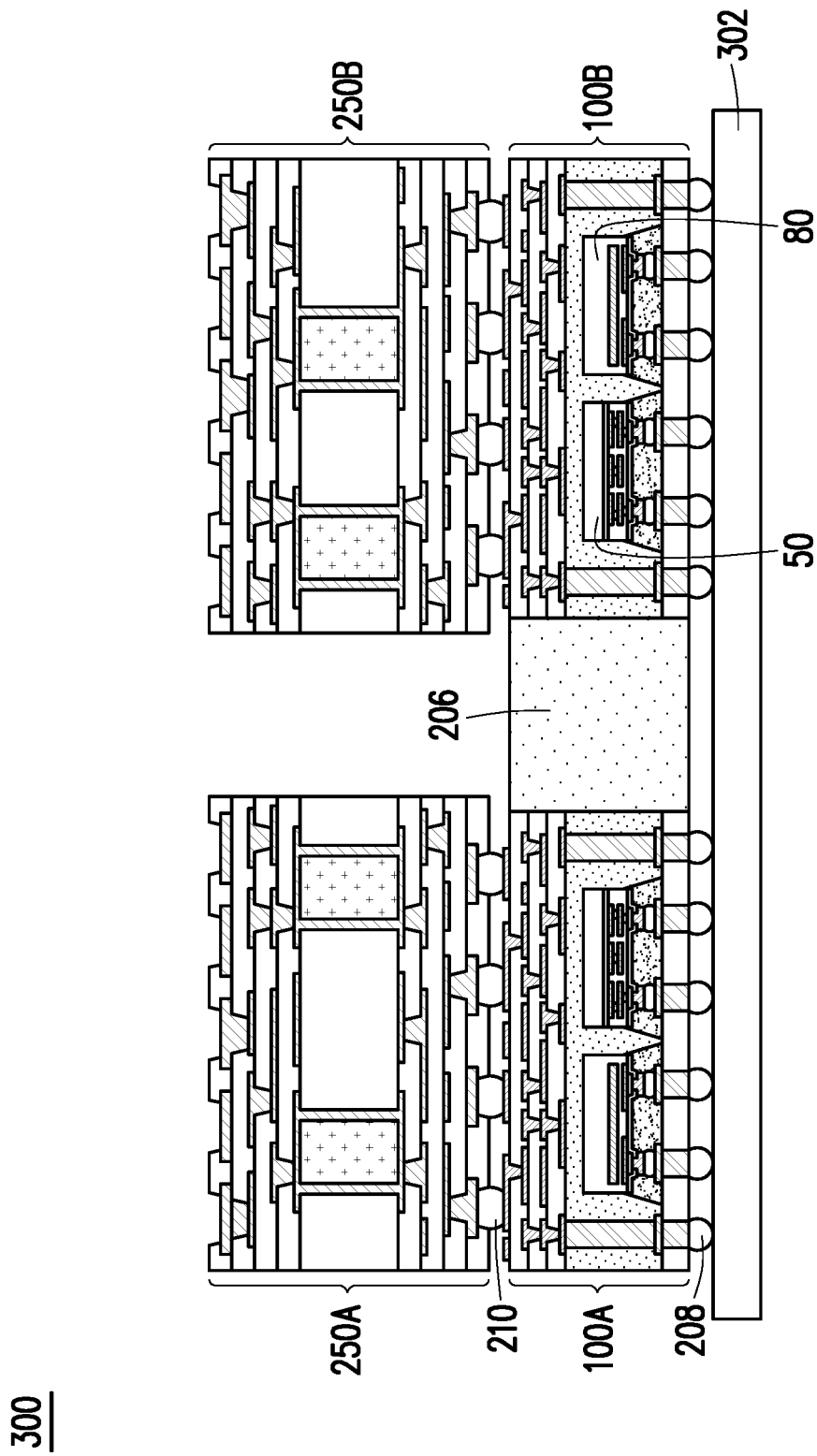

In FIG. 18, core substrates 250A-B are attached to the interconnect structures 100A-B, in accordance with some embodiments. The core substrates 250A-B may be similar to the core substrate 250 shown in FIG. 14. The lateral dimensions of the core substrates 250A-B are shown as larger than the lateral dimensions of the interconnect structures 100A-B, but in other embodiments the core substrates 250A-B may have one or more lateral dimensions smaller than an interconnect structure 100A/B. Attaching the core substrates 250A-B may include placing the core substrates 250A-B on the structure of FIG. 17 such that the conductive connectors 210 physically contact the UBMs 254 of the core substrates 250A-B. For example, FIG. 18 shows the core substrate 250A placed on the interconnect structure 100A and the core substrate 250B placed on the interconnect structure 100B. A reflowing process may then be performed on the conductive connectors 210 to physically and electrically couple the core substrates 250A-B and the interconnect structures 100A-B. FIG. 18 shows a single core substrate 250 attached to each interconnect structure 100, but in other embodiments more than one core substrate 250 may be attached to a single interconnect structure 100 or a single core substrate 250 may be attached to more than one interconnect structure 100.

Figure 19:
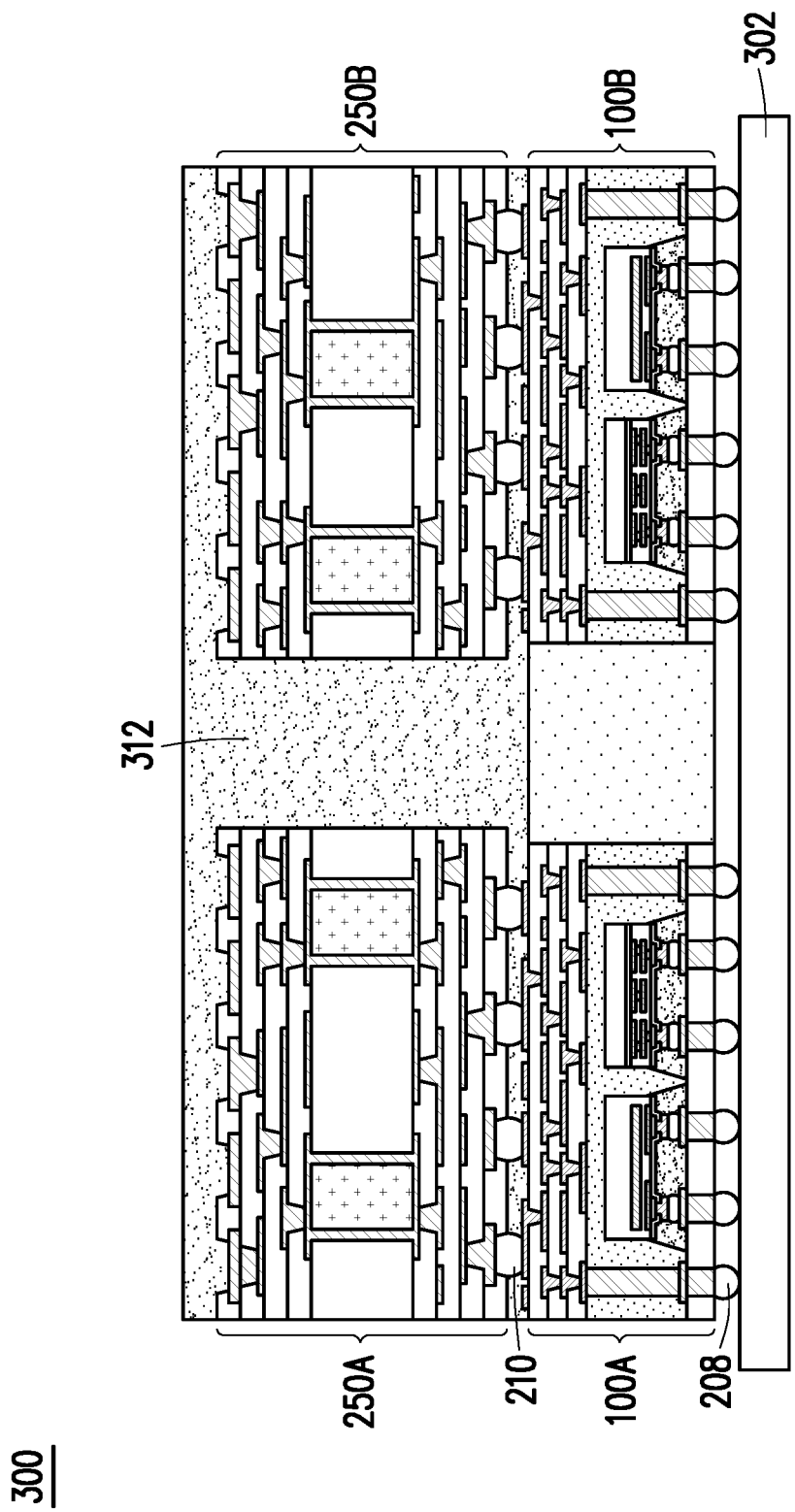

In FIG. 19, an underfill 312 is formed between the interconnect structures 100A-B and the core substrates 250A-B, in accordance with some embodiments. The underfill 312 may surround and protect the conductive connectors 210. The underfill 312 may be formed by a capillary flow process after the core substrates 250A-B are attached or may be formed by a suitable deposition method before the core substrate 250A-B are attached. The underfill 312 may be a molding compound, epoxy, underfill, molding underfill (MUF), resin or the like, and may be similar to the encapsulant 206 or the encapsulant 118 described previously.

Figure 20:
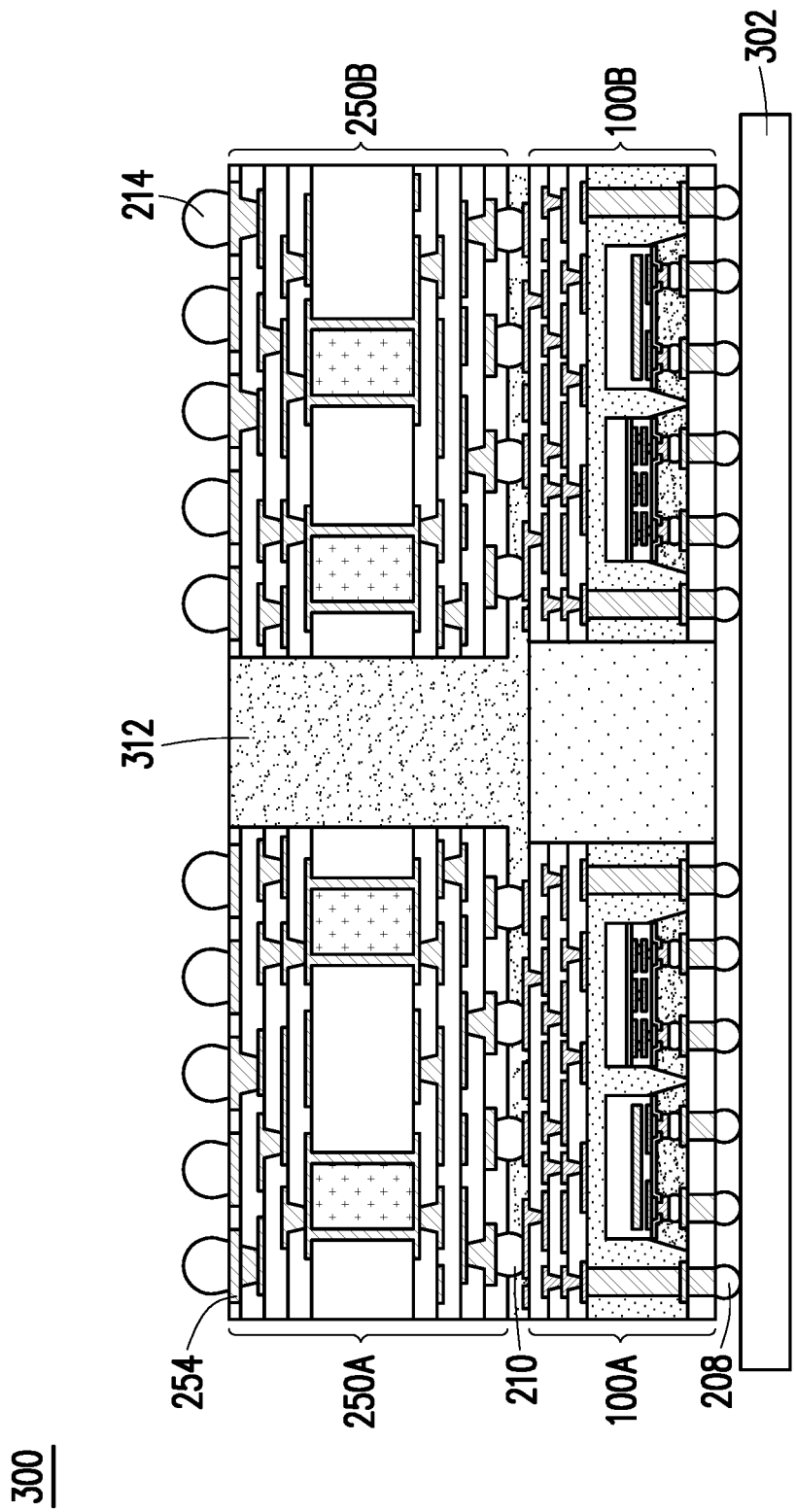

In FIG. 20, a planarization process is performed to remove excess underfill 312 and conductive connectors 214 are formed, in accordance with some embodiments. The planarization process may remove underfill 312 such that the UBMs 254 of the core substrates 250A-B are exposed. After performing the planarization process, surfaces of the underfill 312 and the core substrates 250A-B may be coplanar. The planarization process may comprise a CMP process, a grinding process, and etching process, the like, or a combination thereof. Conductive connectors 214 may then be formed on the UBMs 254 of the core substrates 250A-B. The conductive connectors 214 may be similar to the conductive connectors 214 described for FIG. 15, and may be formed in a similar manner.

Figure 21:
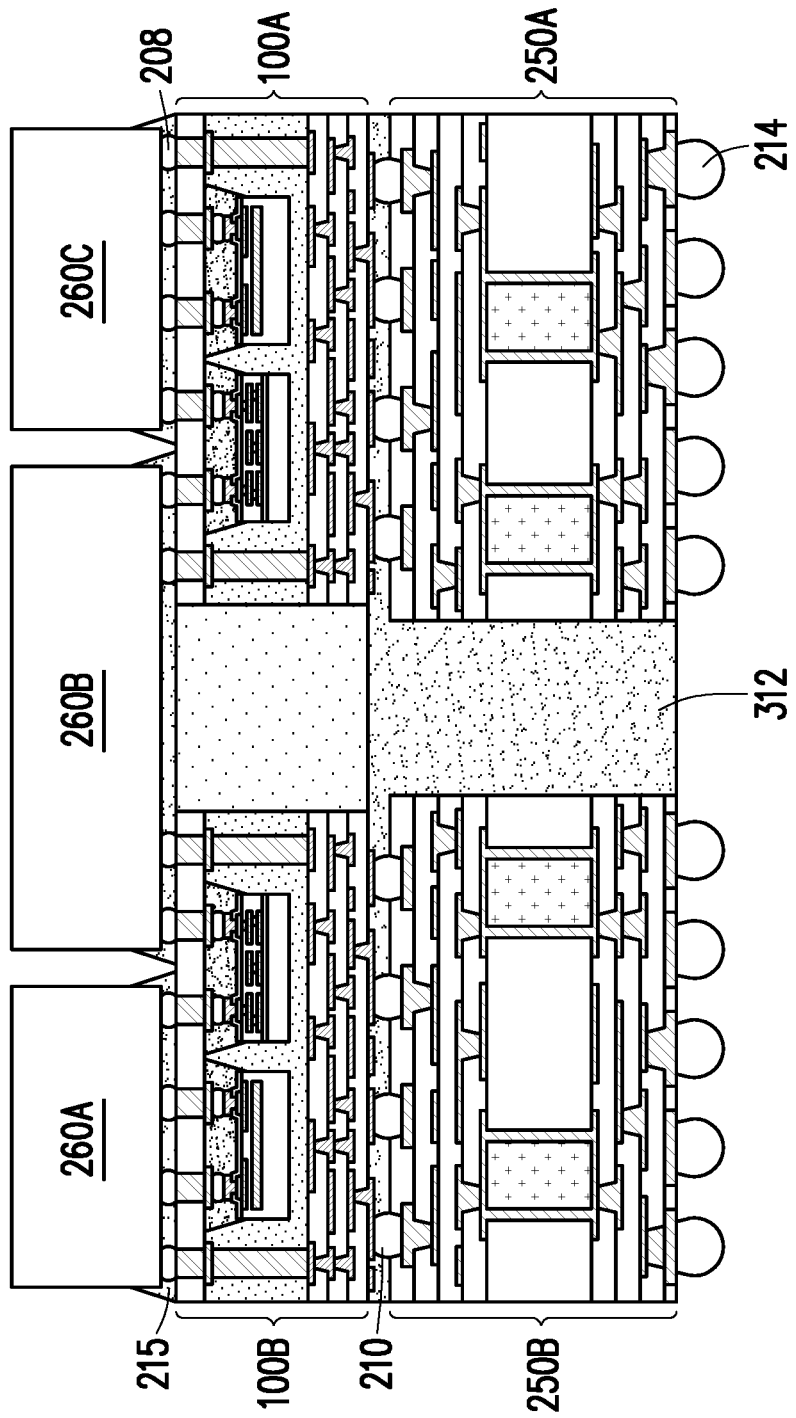

FIG. 21 illustrates the attachment of semiconductor devices 260A-C to form a package 300, in accordance with some embodiments. The semiconductor devices 260A-C may be attached to the conductive connectors 208 after removing the carrier 302 from the structure. The semiconductor devices 260A-C are physically and electrically connected to the conductive connectors 208 to make electrical connection between the semiconductor devices 260A-C and the interconnect structures 100A-B. The semiconductor devices 260A-C may be similar to the semiconductor devices 260A-C described previously for FIG. 16. FIG. 21 shows the attachment of three semiconductor devices 260A-C, but in other embodiments, one, two, or more than three semiconductor devices 260 may be attached to the conductive connectors 208. The semiconductor devices 260A-C may be attached in a different arrangement or configuration than shown.

The semiconductor devices 260A-C may be attached to the conductive connectors 208 using a process similar to that described for FIG. 16. For example, the semiconductor devices 260A-C may be placed on the conductive connectors 208 and a reflow process may be utilized to bond the conductive connectors 208 to the semiconductor devices 260A-C, forming the package 300. The process shown in FIGS. 17 through 21 is a "chip-last" process in which the semiconductor devices 260A-C are attached after the core substrates 250A-B are attached. In other embodiments, the semiconductor devices 260A-C may be attached before the core substrates 250A-B are attached. As shown in FIG. 21, an underfill 215 may be deposited between the semiconductor devices 260A-C and the interconnect structures 100A-B. The underfill 215 may be similar to the underfill 215 described for FIG. 16, and may be formed in a similar manner.

FIGS. 22 through 28 illustrate the formation of a package 400 (see FIG. 28) including multiple interconnect structures 100A-B and one or more via structures 450, in accordance with some embodiments. The interconnect structures 100A-B of the package 400 may be similar to the interconnect structures 100A-B shown in FIG. 9. The package 400 includes a core substrate 250, which may be similar to the core substrate 250 shown in FIG. 14. In other embodiments, multiple core substrates 250 may be used, and an example embodiment is described below for FIG. 30. The package 400 may be similar to the package 200 shown in FIG. 16, except that the package 400 includes one or more via structures 450 (described in greater detail below) in addition to the interconnect structures 100A-B. In some embodiments, the via structures 450 may be used for transmitting electrical signals and/or electrical power to one or more semiconductor devices 260 of the package 400. The via structures 450 can also be configured for use in power applications or to safely provide relatively large voltages or currents. By using via structures 450 that are formed separately from interconnect structures 100, different processes may be used to form features in the via structures 450 that are better suited for high-power applications, such as conductive features having a larger size. Additionally, the manufacturing cost of a package may be reduced and the yield of manufacturing packages may be improved. A package 400 may include a different number or configuration of interconnect structures 100, via structures 450, or core substrates 250 than shown.

Figure 22:
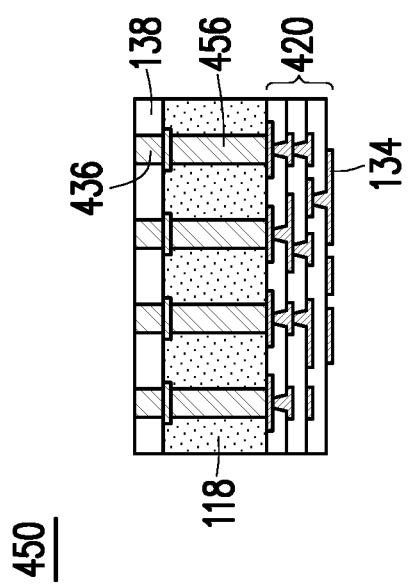
FIG. 22 illustrates a cross-sectional view of an interconnect component, in accordance with some embodiments.

Turning to FIG. 22, a via structure 450 is shown, in accordance with some embodiments. The via structure 450 is similar to the interconnect structure 100 shown in FIG. 9, except that the via structure 450 does not include interconnect components 50 or IPDs 80. In other embodiments, a via structure 450 may contain interconnect components 50 or IPDs 80. The via structure 450 may be formed in a similar manner as described in FIGS. 2-9 for the interconnect structure 100, in some embodiments. The via structure 450 includes a redistribution structure 420, which may be similar to the redistribution structure 120 described previously for the interconnect structure 100 and which may be formed using similar techniques. The via structure 450 includes conductive vias 436, which may be similar to the conductive vias 136 described previously for the interconnect structure 100 and which may be formed using similar techniques. In some embodiments, the redistribution structure 420 or the conductive vias 436 may have conductive features that are larger (e.g., thicker, larger linewidth, larger diameter, etc.) than the corresponding conductive features of the redistribution structure 120 or the conductive vias 136. The via structure 450 also includes through vias 456 that are connected to the redistribution structure 420 and the conductive vias 436. The through vias 456 may be similar to the through vias 116 described previously for the interconnect structure 100 and may be formed using similar techniques. In some embodiments, the through vias 456 may have a larger size than the through vias 116. In some embodiments, the through vias 456 may have a width that is in the range of about 20% and about 200% of a width of the through vias 116. In some cases, forming conductive features with a larger sizes can reduce resistance and improve performance when relatively large currents or voltages are used. The via structure 450 may have dimensions that are larger, smaller, or about the same as the interconnect structure 100.

Figure 23:
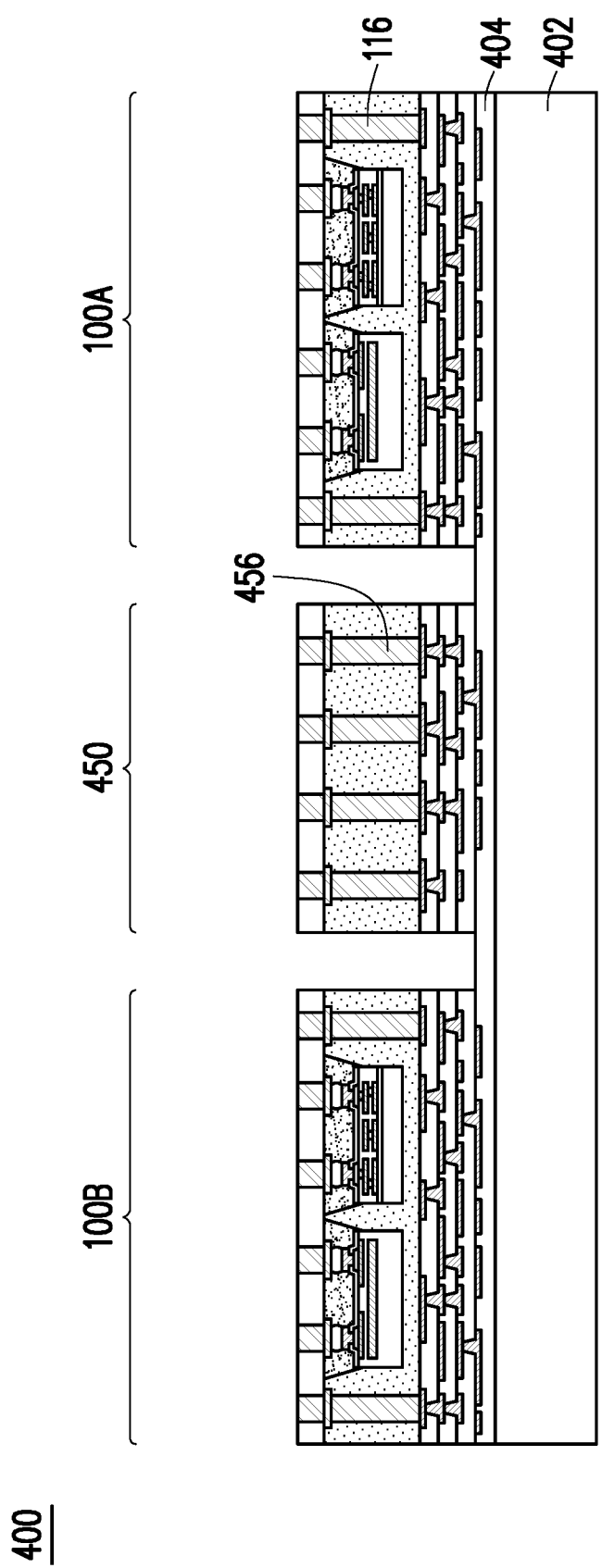
FIGS. 23 through 28 illustrate cross-sectional views of intermediate steps during a process for forming a package with multiple interconnect components, in accordance with some embodiments.

FIG. 23 illustrates the placement of a via structure 450 and interconnect structures 100A-B on a carrier substrate 402, in accordance with some embodiments. The carrier substrate 402 may be similar to the first carrier substrate 102 described previously. The via structure 450 and the interconnect structures 100A-B may be attached to the carrier substrate 402 using, for example, an adhesive layer 404. The adhesive layer 404 may be similar to the release layer 104 described previously, in some embodiments. FIG. 23 shows the placement of one via structure 450 and two interconnect structures 100A-B, but more via structures 450 or interconnect structures 100 may be placed in other embodiments. FIG. 23 shows the via structure 450 placed between the interconnect structures 100A-B, but the via structure 450 and the interconnect structures 100A-B may have a different arrangement in other embodiments.

Figure 24:
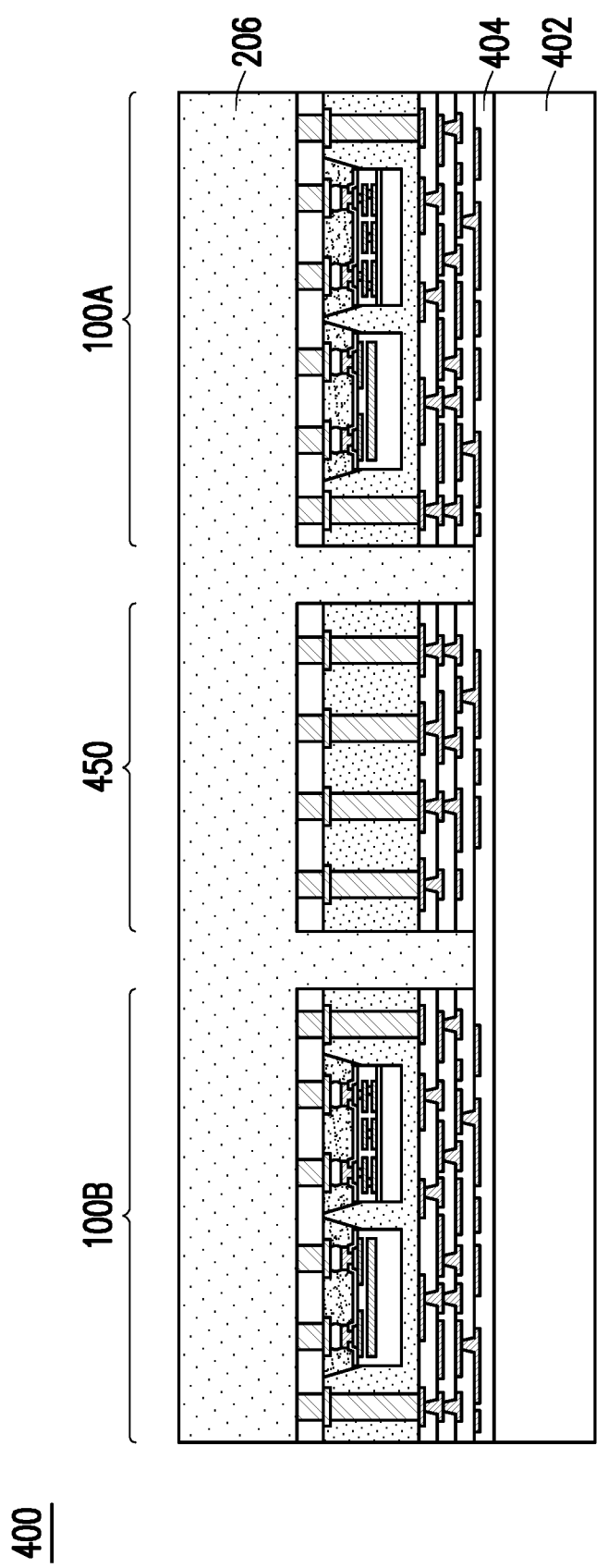

In FIG. 24, an encapsulant 206 is formed on the via structure 450 and the interconnect structures 100A-B, in accordance with some embodiments. The encapsulant 206 may be a molding compound, epoxy, or the like, and may be similar to the encapsulant 206 described previously. The encapsulant 206 may be applied by compression molding, transfer molding, or the like, and may be formed over the carrier substrate 402 such that the via structure 450 and the interconnect structures 100A-B are buried or covered. The encapsulant 206 may be applied in liquid or semi-liquid form and then subsequently cured.

Figure 25:
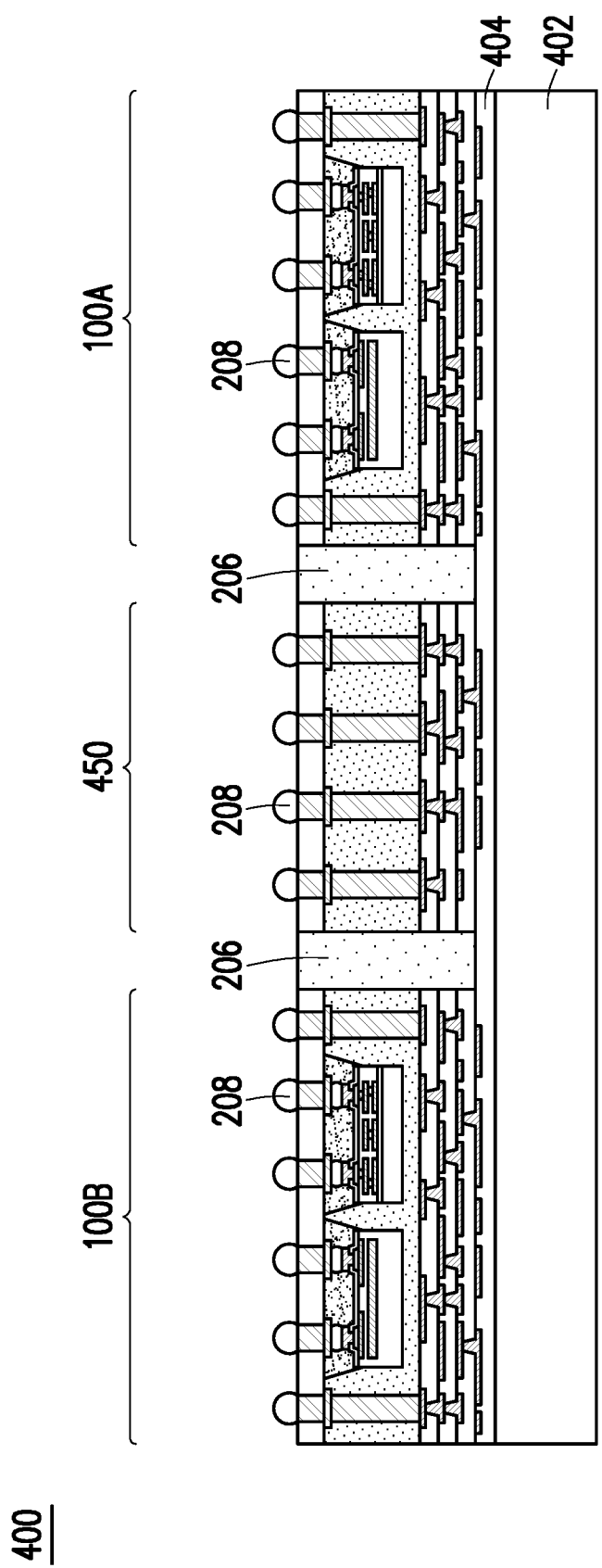

In FIG. 25, a planarization process is performed to remove excess encapsulant 206, and conductive connectors 208 are formed, in accordance with some embodiments. The planarization process may remove encapsulant 206 such that the conductive vias 436 of the via structure 450 and the conductive vias 136 of the interconnect structures 100A-B are exposed. After performing the planarization process, surfaces of the encapsulant 206, the via structure 450, and the interconnect structures 100A-B may be coplanar. The planarization process may comprise a CMP process, a grinding process, and etching process, the like, or a combination thereof.

Still referring to FIG. 25, conductive connectors 208 are formed on the conductive vias 436 of the via structure 450 and the conductive vias 136 of the interconnect structures 100A-B. The conductive connectors 208 may be similar to the conductive connectors 208 described previously for FIG. 12, and may be formed in a similar manner.

Figure 26:
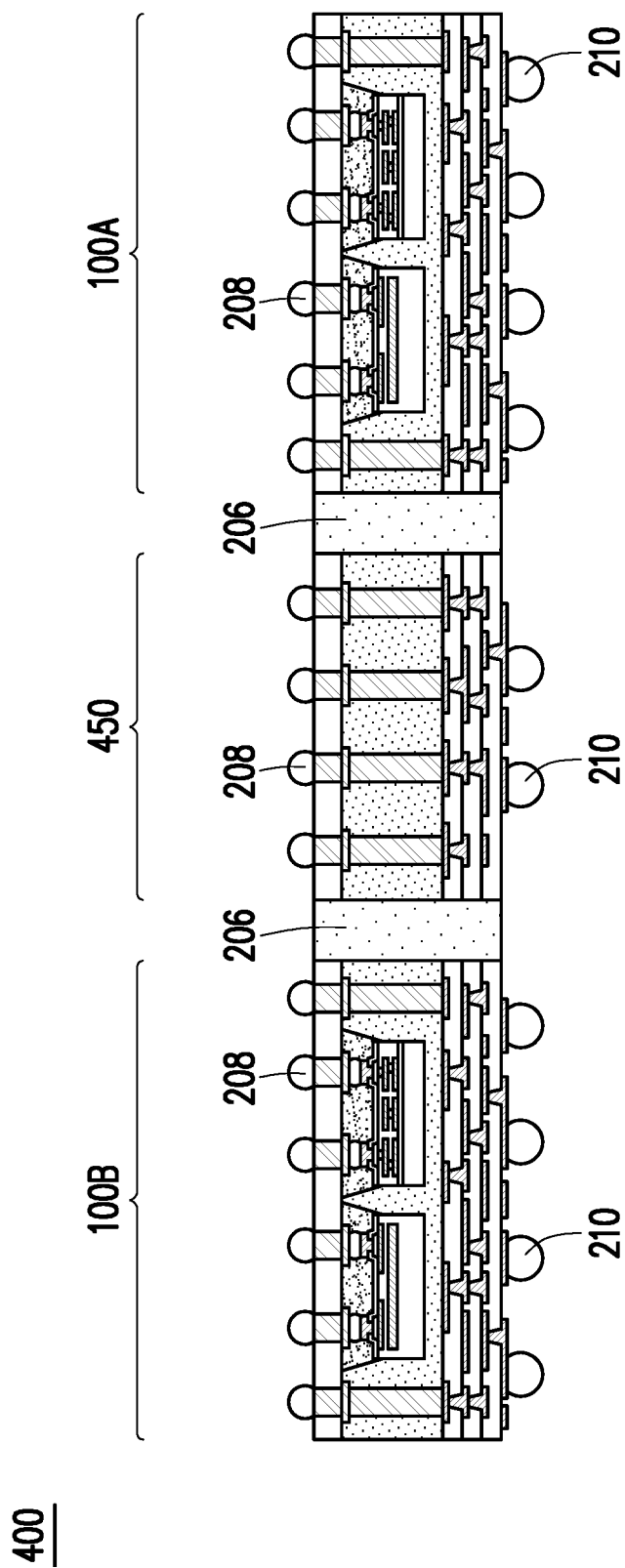

In FIG. 26, the structure is de-bonded from the carrier substrate 402, and conductive connectors 210 are formed on the via structure 450 and the interconnect structures 100A-B, in accordance with some embodiments. The previously deposited encapsulant 206 secures the via structure 450 and the multiple interconnect structures 100A-B, forming a substantially rigid structure, which may be referred to as a "connection structure" herein. The conductive connectors 210 may be formed on the redistribution structure 420 of the via structure 450 and on the redistribution structures 120 of the interconnect structures 100A-B. The conductive connectors 210 may be similar to the conductive connectors described for FIG. 13, and may be formed in a similar manner.

Figure 27:
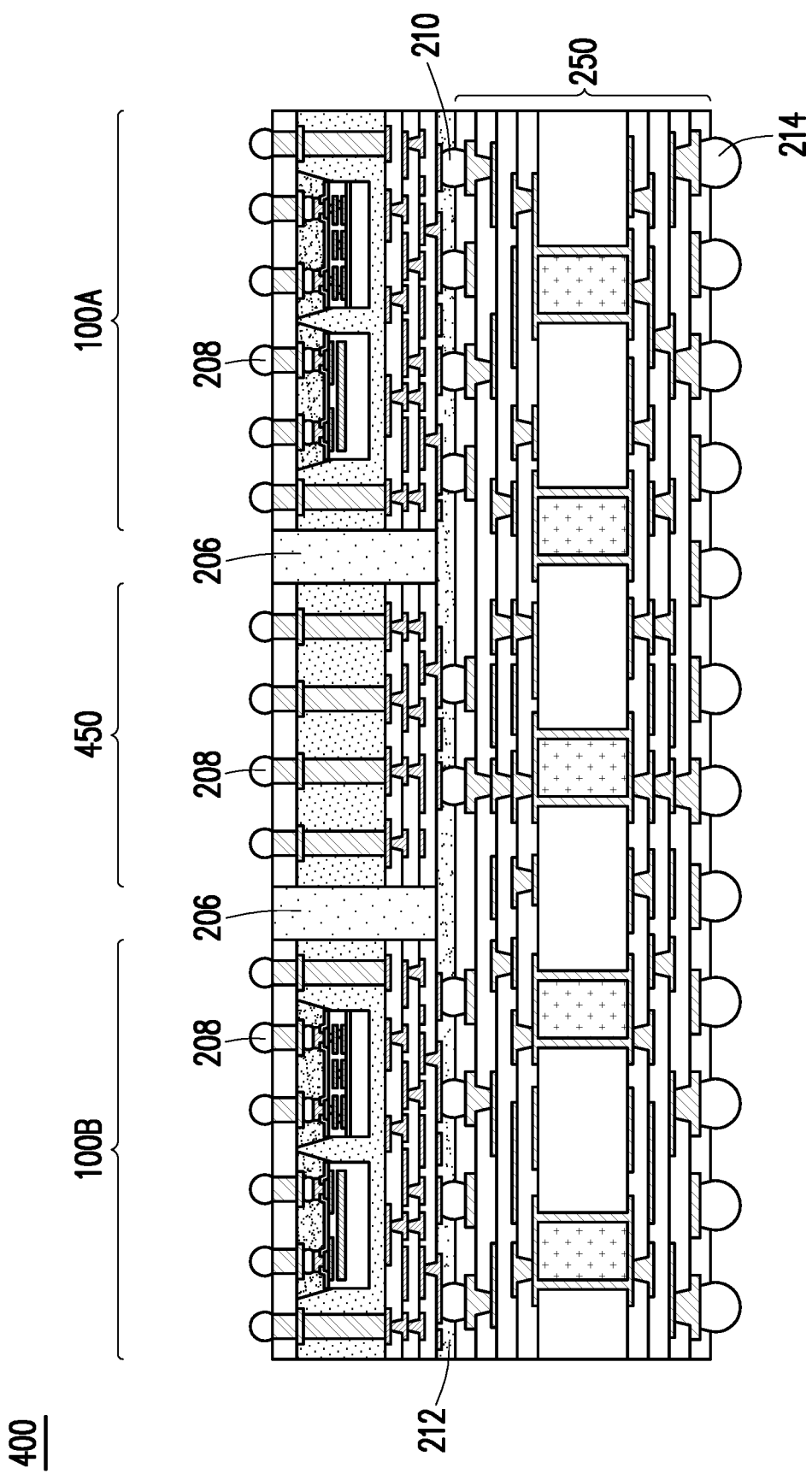

Turning to FIG. 27, a core substrate 250 is attached to the via structure 450 and the interconnect structures 100A-B, in accordance with some embodiments. The core substrate 250 may be similar to the core substrate 250 shown in FIG. 14. Attaching the core substrate 250 may include placing the connection structure of FIG. 26 on the core substrate 250 such that the conductive connectors 210 physically contact the UBMs 254 of one side of the core substrate 250. A reflowing process may then be performed on the conductive connectors 210 to physically and electrically couple the core substrate 250 to the vias structure 450 and the interconnect structures 100A-B.

In some embodiments, an underfill 212 may be formed between the via structure 450 and the core substrate 250 and between the interconnect structures 100A-B and the core substrate 250. The underfill 212 may surround the conductive connectors 210. The underfill 212 may be formed by a capillary flow process after the core substrate 250 is attached or may be formed by a suitable deposition method before the core substrate 250 is attached. The underfill 212 may be similar to the underfill 212 described previously for FIG. 15.

Still referring to FIG. 27, conductive connectors 214 may be formed on the core substrate 250, in some embodiments. The conductive connectors 214 may be formed on UBMs 254 of the core substrate 250, for example. The conductive connectors 214 may be similar to the conductive connectors 214 described for FIG. 15, and may be formed in a similar manner.

Figure 28:
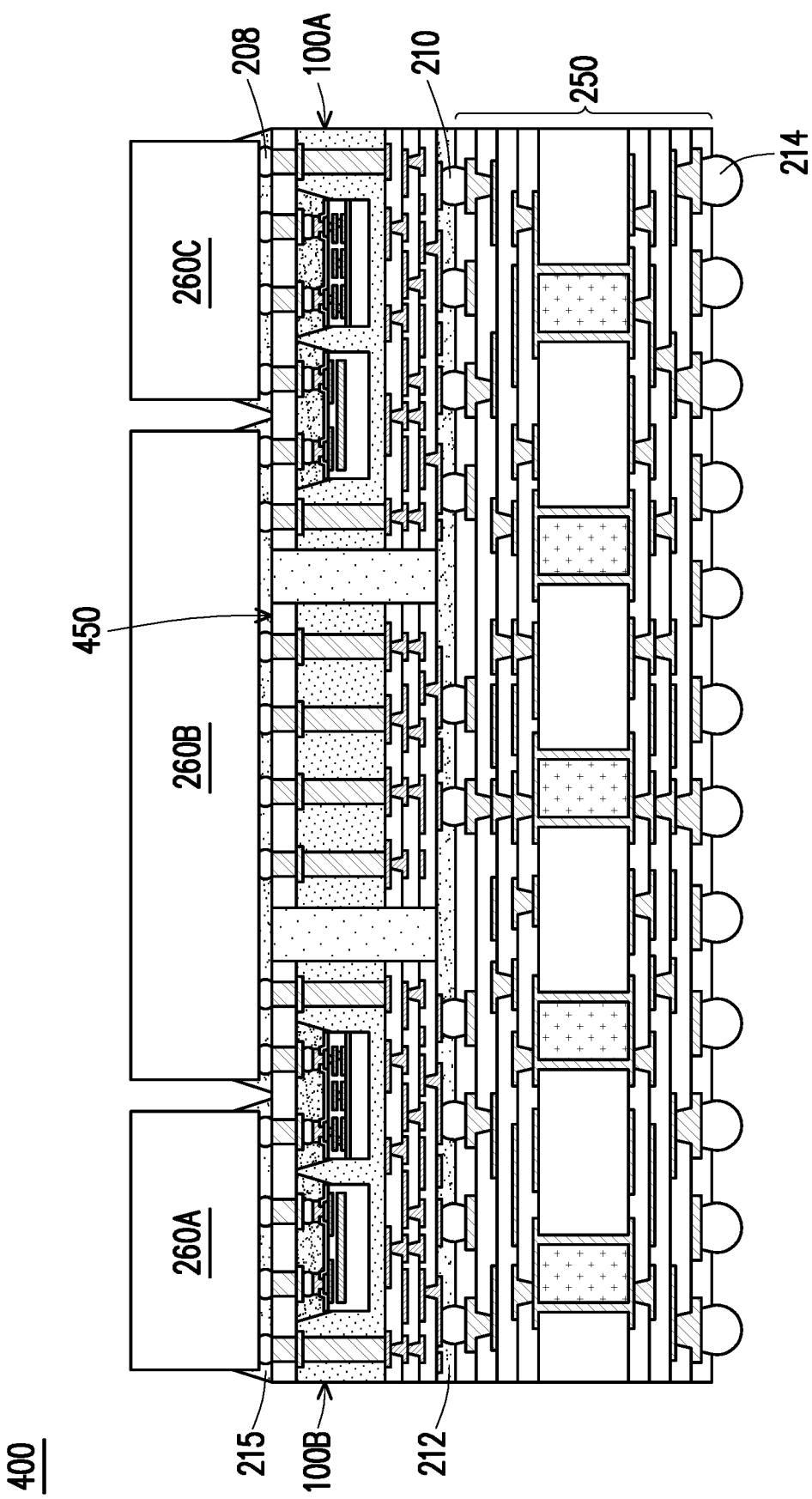

FIG. 28 illustrates the attachment of semiconductor devices 260A-C to form a package 400, in accordance with some embodiments. The semiconductor devices 260A-C are physically and electrically connected to the conductive connectors 208 to make electrical connection between the semiconductor devices 260A-C, the via structure 450, and the interconnect structures 100A-B. FIG. 28 shows only the semiconductor device 260B being directly coupled to the via structure 450, but in other embodiments the via structure 450 may be directly coupled to a different semiconductor device 260 or multiple semiconductor devices 260. The semiconductor devices 260A-C may be similar to the semiconductor devices 260A-C described previously for FIG. 16. FIG. 28 shows the attachment of three semiconductor devices 260A-C, but in other embodiments, one, two, or more than three semiconductor devices 260 may be attached to the conductive connectors 208. The semiconductor devices 260A-C may be attached in a different arrangement or configuration than shown.

The semiconductor devices 260A-C may be attached to the conductive connectors 208 using a process similar to that described for FIG. 16. For example, the semiconductor devices 260A-C may be placed on the conductive connectors 208 and a reflow process may be utilized to bond the conductive connectors 208 to the semiconductor devices 260A-C, forming the package 400. The process shown in FIGS. 23 through 28 is a "chip-last" process in which the semiconductor devices 260A-C are attached after the core substrate 250 is attached. In other embodiments, the semiconductor devices 260A-C may be attached before the core substrate 250 is attached. As shown in FIG. 28, an underfill 215 may be deposited under the semiconductor devices 260A-C. The underfill 215 may be similar to the underfill 215 described for FIG. 16, and may be formed in a similar manner.

Figure 29:
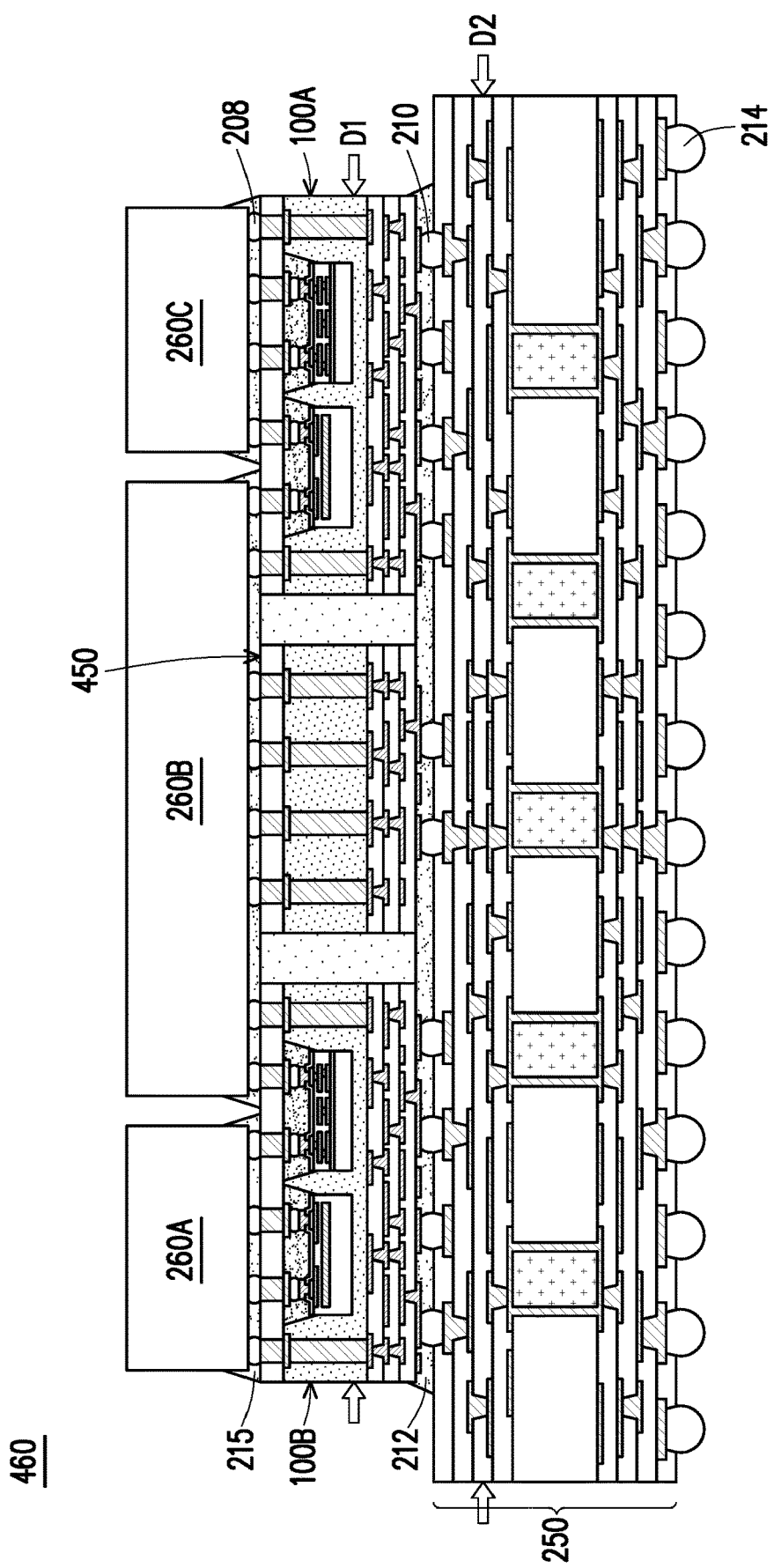
FIG. 29 illustrates a cross-sectional view of a package with multiple interconnect components, in accordance with some embodiments.

FIG. 29 illustrates a package 460 that includes a via structure 450 and interconnect structures 100A-B, in accordance with some embodiments. The package 460 is similar to the package 400 shown in FIG. 28, except the core substrate 250 of FIG. 29 has larger dimensions than the core substrate 250 shown in FIG. 28. The package 460 may be formed in a similar manner as the package 400, in some embodiments. For example, a structure similar to that shown in FIG. 26 may be formed using similar processes. The structure may then be attached to the core substrate 250 using techniques similar to those described for FIG. 27. For example, the conductive connectors 210 of the structure may be placed on the core substrate 250 and then a reflowing process may be performed. As shown in FIG. 29, the structure may have a dimension D1 that is less than a dimension D2 of the core substrate 250. An underfill 212 may be deposited between the structure and the core substrate 250, which may be similar to the underfill 212 described previously for FIG. 15.

The semiconductor devices 260A-C may then be attached to the conductive connectors 208 using a process similar to that described for FIG. 16. For example, the semiconductor devices 260A-C may be placed on the conductive connectors 208 and a reflow process may be utilized to bond the conductive connectors 208 to the semiconductor devices 260A-C, forming the package 460. This process is a "chip-last" process in which the semiconductor devices 260A-C are attached after the core substrate 250 is attached. In other embodiments, the semiconductor devices 260A-C may be attached before the core substrate 250 is attached. As shown in FIG. 29, an underfill 215 may be deposited under the semiconductor devices 260A-C. The underfill 215 may be similar to the underfill 215 described for FIG. 16, and may be formed in a similar manner.

Figure 30:
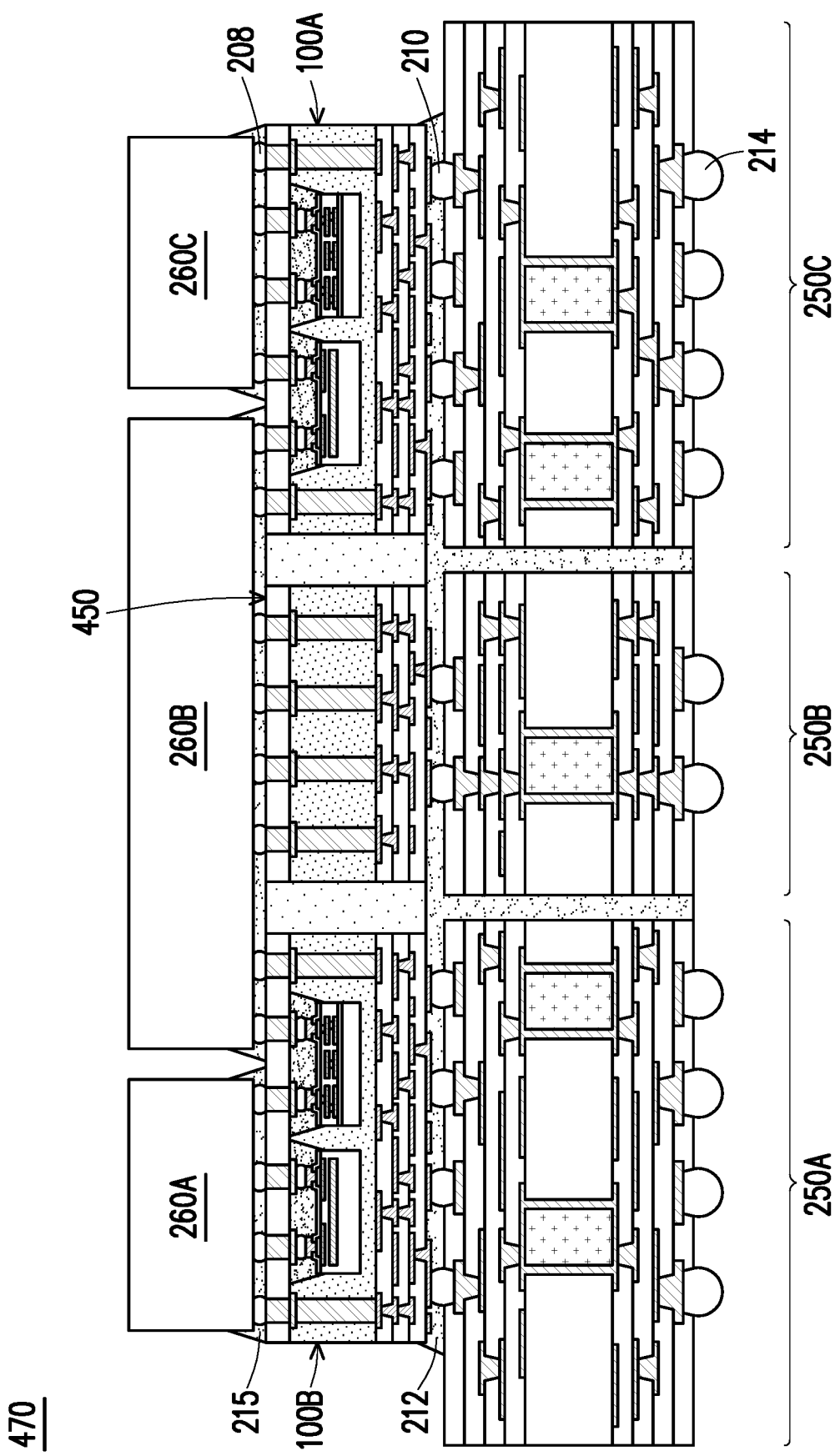
FIG. 30 illustrates a cross-sectional view of a package with multiple interconnect components and multiple core substrates, in accordance with some embodiments.

FIG. 30 illustrates a package 470 that includes a via structure 450, interconnect structures 100A-B, and multiple core substrates 250A-C, in accordance with some embodiments. The package 470 is similar to the package 460 shown in FIG. 29, except that the package 470 has multiple core substrates 250A-C. The core substrates 250A-C of the package 470 may be similar to the core substrate 250 shown in FIG. 14, except that the core substrates 250A-C may have relatively smaller dimensions than the core substrate 250 shown in FIG. 14. The core substrates 250A-C of package 470 may be similar to the core substrates 250A-B of the package 300 shown in FIG. 21. By using multiple core substrates 250A-C within a package 470 instead of a single, larger core substrate 250, the manufacturing cost may be reduced and the yield may be improved. A package 470 may include a different number or configuration of via structures 450, interconnect structures 100, or core substrates 250 than shown. For example, multiple core substrates 250 may be attached to a single via structure 450 or interconnect structure 100, or multiple via structures 450 and/or interconnect structures 100 may be attached to the same core substrate 250.

The package 470 may be formed using techniques similar to those described for the package 300 in FIGS. 17-21 or for the package 400 in FIGS. 22-28, in some embodiments. For example, a structure similar to that shown in FIG. 26 may be formed using similar processes. Multiple core substrates 250A-C may then be attached to the structure using techniques similar to those described for FIG. 18. For example, the core substrates 250A-C may be placed on the conductive connectors 210 of the structure and then a reflowing process may be performed. An underfill 212 may be deposited between the structure and the core substrates 250A-C, which may be similar to the underfill 212 described previously for FIG. 15.

The semiconductor devices 260A-C may then be attached to the conductive connectors 208 using a process similar to that described for FIG. 16. For example, the semiconductor devices 260A-C may be placed on the conductive connectors 208 and a reflow process may be utilized to bond the conductive connectors 208 to the semiconductor devices 260A-C, forming the package 470. This process is a "chip-last" process in which the semiconductor devices 260A-C are attached after the core substrates 250A-C are attached. In other embodiments, the semiconductor devices 260A-C may be attached before the core substrates 250A-C are attached. As shown in FIG. 30, an underfill 215 may be deposited under the semiconductor devices 260A-C. The underfill 215 may be similar to the underfill 215 described for FIG. 16, and may be formed in a similar manner.

FIGS. 31 through 39 illustrate the formation of a package 500 (see FIG. 39) including multiple interconnect structures 512A-B and through vias 510, in accordance with some embodiments. The package 500 may be similar to the package 200 shown in FIG. 16, except that the package 500 includes one or more through vias 510 in addition to the interconnect structures 512A-B. The interconnect structures 512A-B of the package 500 may be similar to the interconnect structures 100A-B shown in FIG. 9, except that the dielectric layer 138 and conductive vias 136 are not formed over the conductive lines 110 before attachment (see FIG. 34). The package 500 includes a core substrate 250, which may be similar to the core substrate 250 shown in FIG. 14. In other embodiments, multiple core substrates 250 may be used. In some embodiments, the through vias 510 may be used for transmitting electrical signals and/or electrical power to one or more semiconductor devices 260 of the package 500. The through vias 510 can also be configured for use in power applications or to safely provide relatively large voltages or currents. By using through vias 510 that are formed separately from interconnect structures 512, the through vias 510 may be formed having a larger size than conductive features of the interconnect structures 512, such as the through vias 116. Additionally, the manufacturing cost of a package may be reduced and the yield of manufacturing packages may be improved. A package 500 may include a different number or configuration of interconnect structures 512 or through vias 510 than shown.

Figure 31:
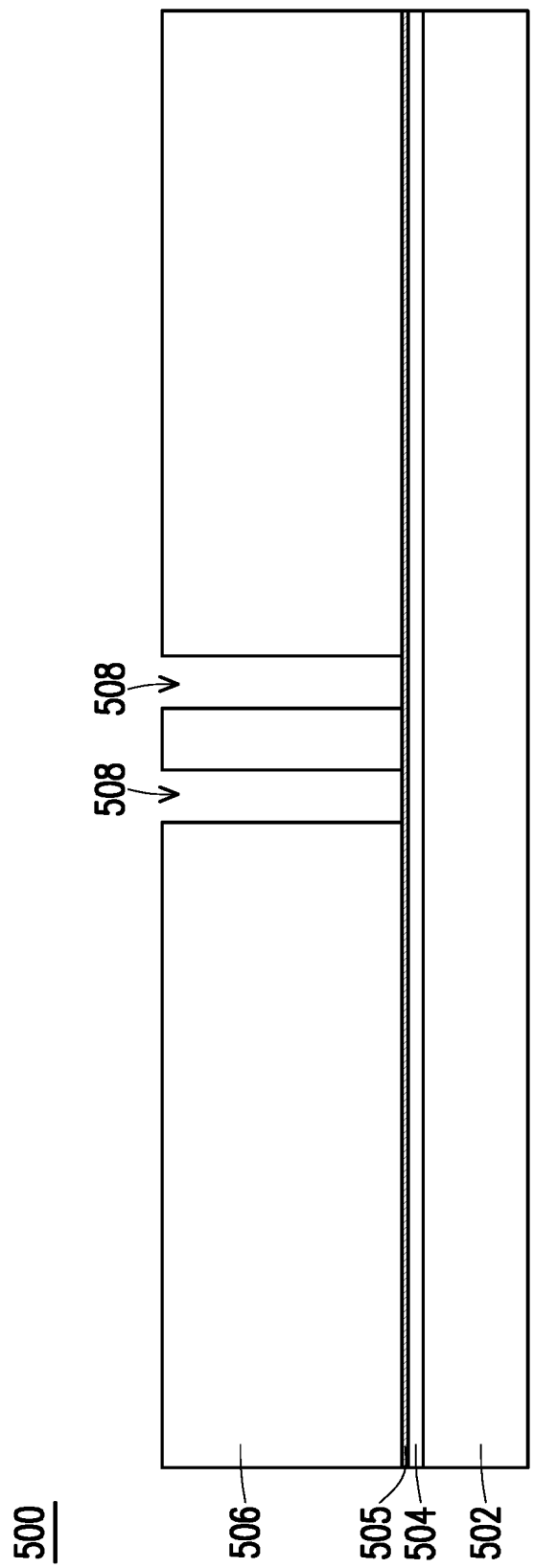
Figure 32:
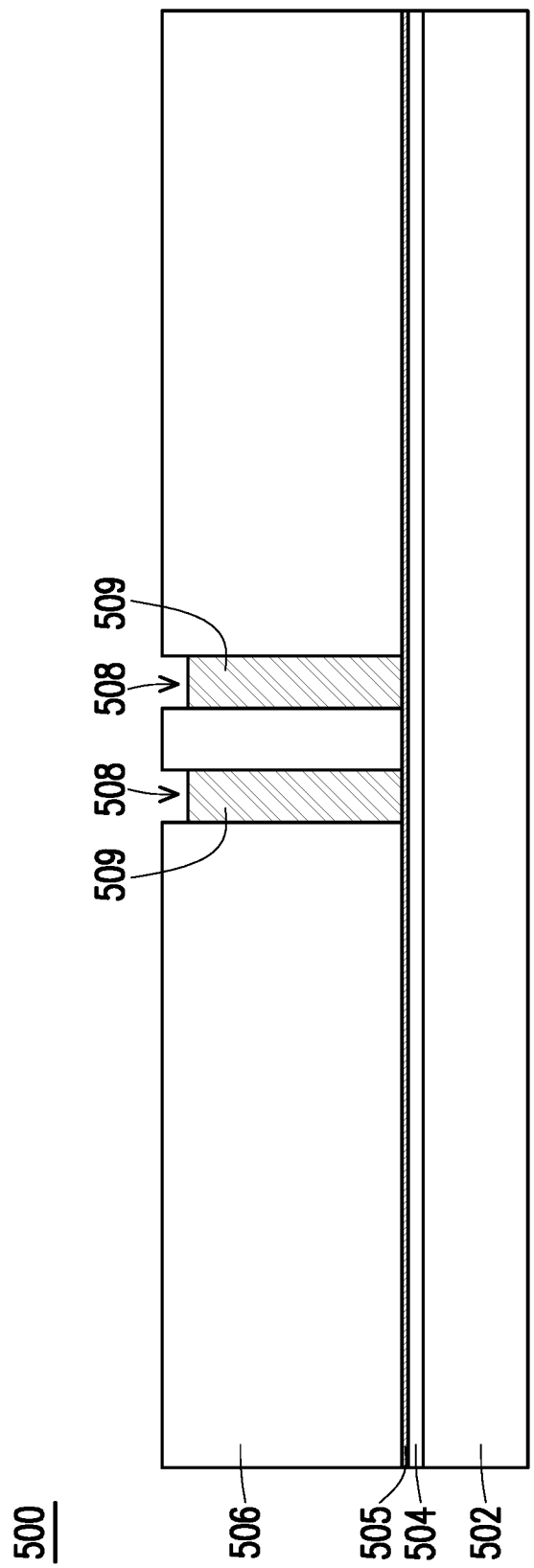
Figure 33:
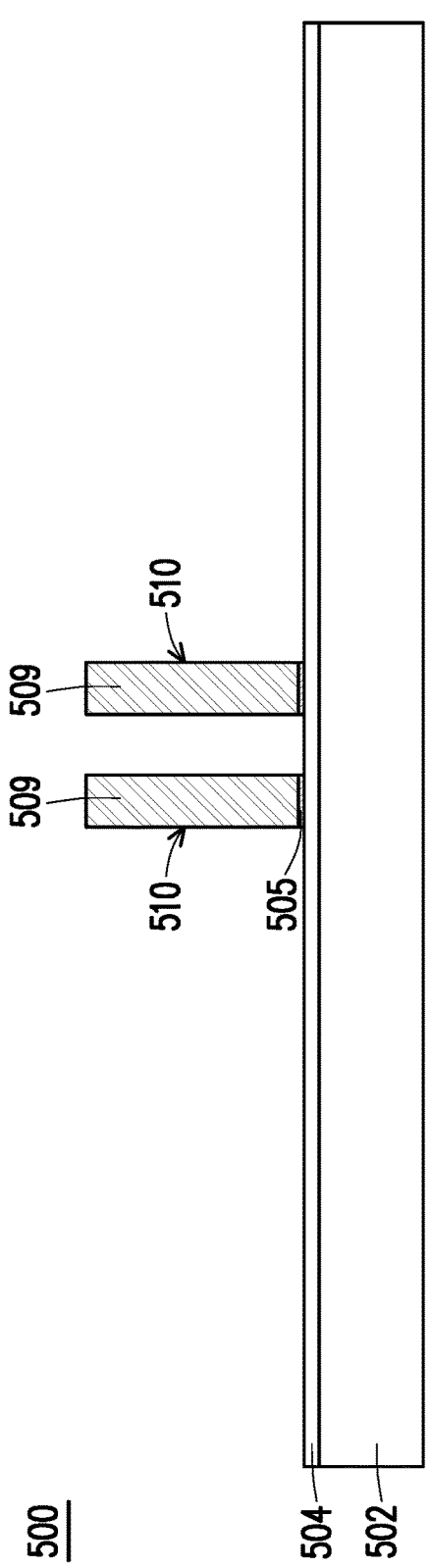

In FIGS. 31-33, through vias 510 are formed on a carrier substrate 502, in accordance with some embodiments. The carrier substrate 502 may be similar to the first carrier substrate 102 described previously. A release layer 504 may be formed on the carrier substrate 502, and may be similar to the release layer 104 described previously. FIGS. 31-33 show an example for forming the through vias 510, but other techniques may be used in other embodiments. In some embodiments, the through vias 510 are formed using techniques similar to those used for forming the through vias 116 described for FIG. 4.

Turning to FIG. 31, a seed layer 505 may be formed over the carrier substrate 502. For example, the seed layer 505 may be formed over the release layer 504, if present. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. In some embodiments, the seed layer 505 may be similar to the seed layers described for FIG. 3 or FIG. 4 and may be formed in a similar manner. In other embodiments, a seed layer 505 is not used.

Still referring to FIG. 31, a photoresist 506 is formed and patterned on the seed layer 505. The photoresist 506 may be formed and patterned using suitable photolithography techniques. For example, the photoresist 506 may be formed by spin coating or the like and may be exposed to light for patterning. The pattern formed in the photoresist 506 corresponds to the through vias 510. For example, the patterning may form openings 508 through the photoresist 506 that expose the seed layer 505.

In FIG. 32, a conductive material 509 is formed in the openings 508 of the photoresist 506 and on the exposed portions of the seed layer 505. The conductive material 509 may be formed by plating, such as electroplating or electroless plating, or the like. The conductive material may comprise a metal, like copper, titanium, tungsten, aluminum, or the like, and may be similar to the conductive material of the through vias 116 described for FIG. 4.

In FIG. 33, the photoresist 506 and portions of the seed layer 505 on which the conductive material 509 is not formed are removed, forming the through vias 510. The photoresist 506 may be removed by an acceptable ashing or stripping process, such as using an oxygen plasma or the like. Once the photoresist 506 is removed, exposed portions of the seed layer 505 are removed, such as by using an acceptable etching process, such as by wet or dry etching. The remaining portions of the seed layer 505 and conductive material 509 form the through vias 510. In some embodiments, the through vias 510 may be formed having a larger size than the through vias 116 of the interconnect structures 100. In some embodiments, the through vias 510 may have a width that is in the range of about 20% and about 200% of a width of the through vias 116. In some cases, forming through vias with a larger size can reduce resistance and improve performance when relatively large currents or voltages are used.

Figure 34:
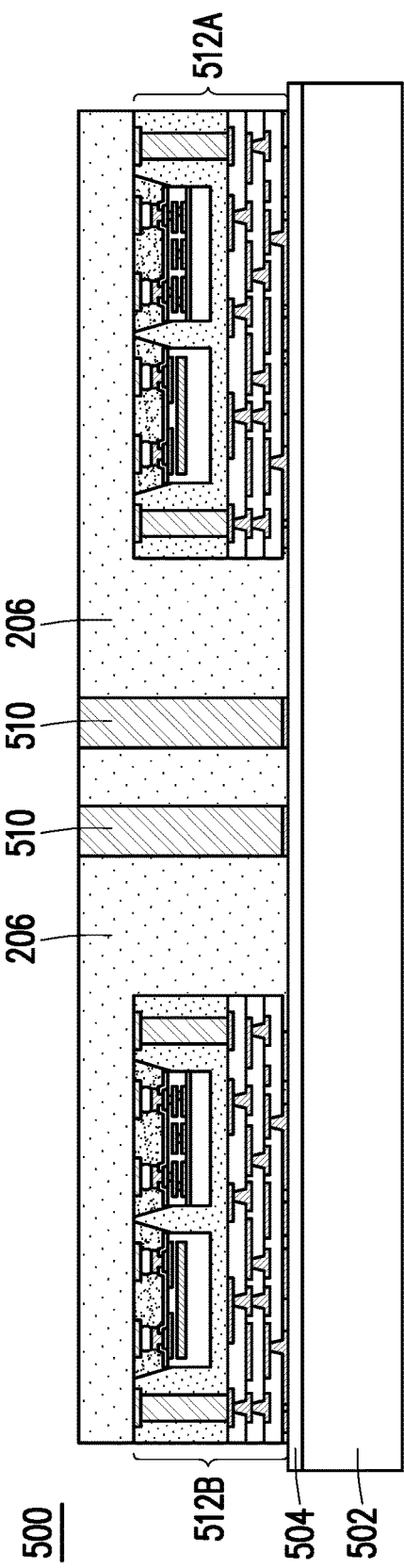

FIG. 34 illustrates the placement of interconnect structures 512A-B on the carrier substrate 502, in accordance with some embodiments. As shown in FIG. 34, the interconnect structures 512A-B may be placed such that redistribution structure 120 of each interconnect structure 512A-B faces the carrier substrate 502. FIG. 34 shows the placement of two interconnect structures 512A-B, but more than two interconnect structures 512 may be placed in other embodiments. FIG. 34 shows the through vias 510 as located between the interconnect structures 512A-B, but the through vias 510 and the interconnect structures 512A-B may have any suitable arrangement.

Still referring to FIG. 34, an encapsulant 206 is formed on the through vias 510 and the interconnect structures 512A-B, in accordance with some embodiments. The encapsulant 206 may be a molding compound, epoxy, resin, or the like, and may be similar to the encapsulant 206 described previously for FIG. 11. The encapsulant 206 may be applied by compression molding, transfer molding, or the like, and may be formed over the carrier substrate 502 such that the through vias 510 and/or the interconnect structures 512A-B are buried or covered. The encapsulant 206 may be applied in liquid or semi-liquid form and then subsequently cured. The encapsulant 206 may surround the through vias 510, which separates and insulates the through vias 510 from the interconnect structures 512A-B.

In FIG. 35, a planarization process is performed to remove excess encapsulant 206, in accordance with some embodiments. The planarization process may remove encapsulant 206 such that the through vias 510 and the conductive lines 110 of the interconnect structures 512A-B are exposed. The planarization process may remove portions of the through vias 510, in some embodiments. After performing the planarization process, surfaces of the encapsulant 206, the through vias 510, and the interconnect structures 512A-B may be coplanar. The planarization process may comprise a CMP process, a grinding process, and etching process, the like, or a combination thereof.

In FIG. 36, conductive vias 536 and conductive connectors 208 are formed, in accordance with some embodiments. The conductive vias 536 are formed on the conductive lines 110 of the interconnect structures 512A-B and on the through vias 510. In this manner, the conductive vias 536 are electrically connected to the through vias 510 and the through vias 116, the interconnect components 50, and the IPDs 80 of the interconnect structures 512A-B. In some embodiments, the conductive vias 536 may comprise under-bump metallurgies (UBMs). The conductive vias 536 may be similar to the conductive vias 136 described for FIG. 8, and may be formed in a similar manner. For example, a seed layer (not shown) may be deposited, and then a photoresist may be formed and patterned on the seed layer. The patterning forms openings through the photoresist to expose the seed layer, where the openings in the photoresist correspond to the conductive vias 536. A conductive material is then formed in the openings of the photoresist and on the exposed portions of the seed layer. The combination of the conductive material and underlying portions of the seed layer form the conductive vias 536. The photoresist and portions of the seed layer on which the conductive material is not formed are removed.

Still referring to FIG. 36, a dielectric layer 538 may be formed on and around the conductive vias 536, in accordance with some embodiments. The dielectric layer 538 may be similar to the dielectric layer 138 described for FIG. 8, and may be formed in a similar manner. After formation, the dielectric layer 538 surrounds the conductive vias 536 and may extend over the encapsulant 206, the through vias 510, and the interconnect structures 512A-B. The dielectric layer 538 may provide electrical isolation and environmental protection for the conductive vias 536. The dielectric layer 538 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; an encapsulant, molding compound, epoxy, or the like; or a combination thereof. The dielectric layer 538 may be formed, for example, by spin coating, lamination, chemical vapor deposition (CVD), or the like. After forming the dielectric layer 538, a planarization process (e.g., a CMP or grinding process) may be performed to expose the conductive vias 536, in some embodiments.

In other embodiments, the dielectric layer 538 may be formed before the conductive vias 536. In such embodiments, openings are formed through the dielectric layer 538 to expose the through vias 510 and portions of the conductive lines 110. The openings may be formed, for example, using laser drilling, etching, or the like. The conductive vias 536 are then formed in the openings to make physical and electrical contact with the conductive lines 110. After forming the conductive vias 536, a planarization process (e.g., a CMP or grinding process) may be performed, in some embodiments.

Figure 37:
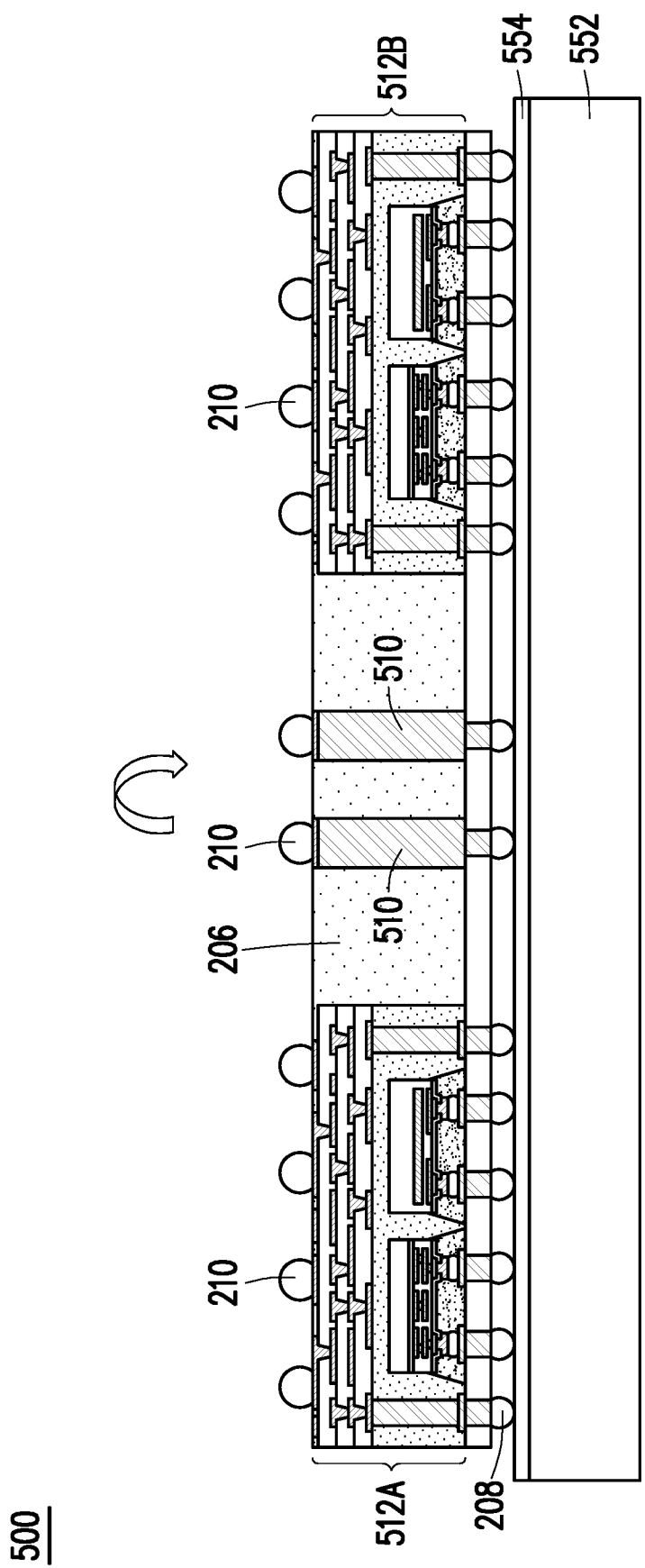

In FIG. 37, the structure is de-bonded and conductive connectors 210 are formed, in accordance with some embodiments. The de-bonding is performed to detach the carrier substrate 502 from the structure. The structure is then flipped over and attached to a different carrier substrate 552. The carrier substrate 552 may be similar to the carrier substrate 502 or may be, for example, a tape. A release layer 554 may be formed on the carrier substrate 502 to facilitate attachment of the structure to the carrier substrate 502. The release layer 554 may be similar to the release layer 104 or may be, for example, an adhesive layer. The previously deposited encapsulant 206 secures the through vias 510 and the multiple interconnect structures 512A-B, forming a substantially rigid structure, which may be referred to as a "connection structure" herein. The conductive connectors 210 may be formed on the through vias 510 and on the redistribution structures 120 of the interconnect structures 512A-B. The conductive connectors 210 may be similar to the conductive connectors described for FIG. 13, and may be formed in a similar manner.

Figure 38:
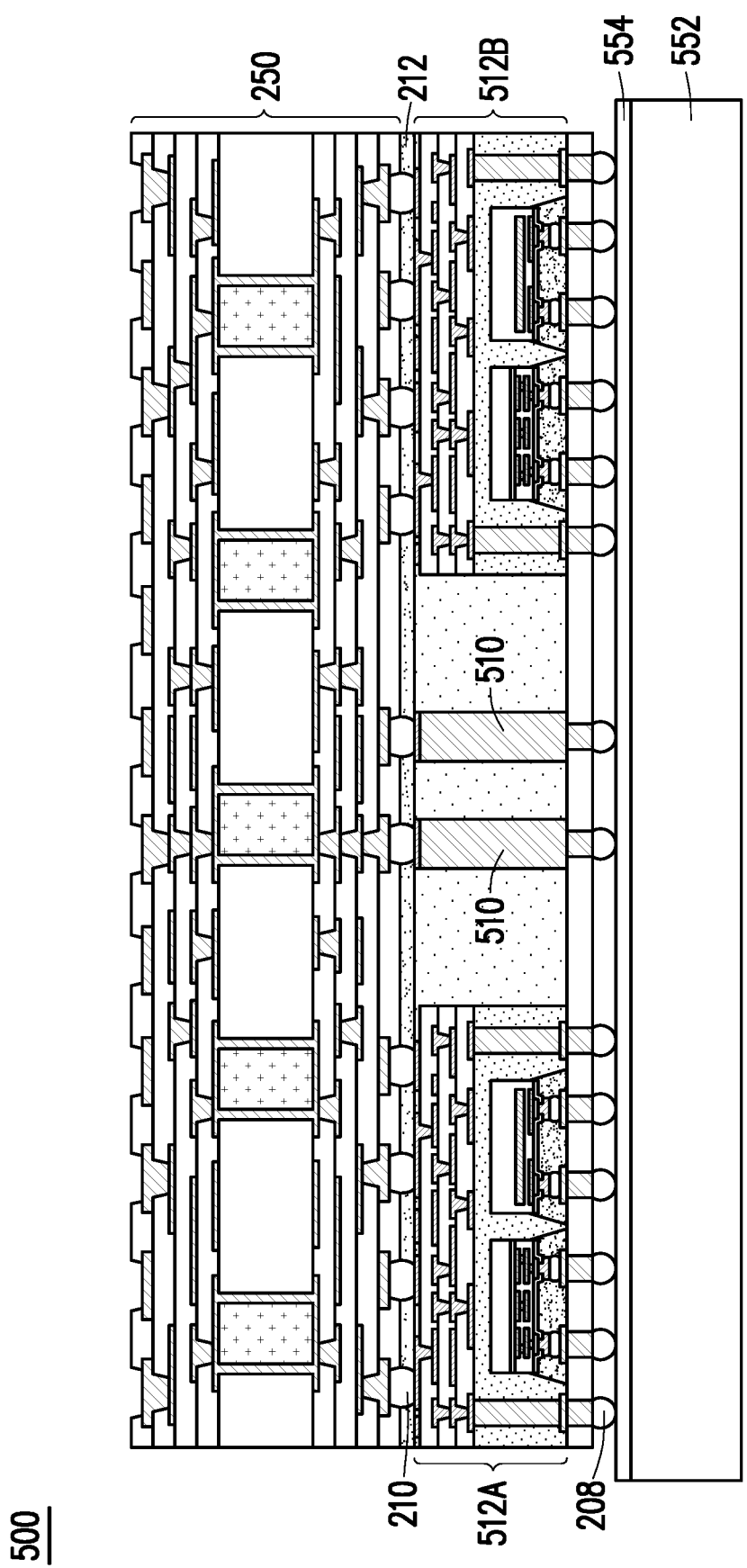

In FIG. 38, a core substrate 250 is attached to the through vias 510 and the interconnect structures 512A-B, in accordance with some embodiments. The core substrate 250 may be similar to the core substrate 250 shown in FIG. 14. In some embodiments, more than one core substrate 250 is attached. Attaching the core substrate 250 may include placing the core substrate 250 on the structure of FIG. 37 such that the conductive connectors 210 physically contact the UBMs 254 of the core substrate 250. A reflowing process may then be performed on the conductive connectors 210 to physically and electrically couple the core substrate 250 to the through vias 510 and the interconnect structures 100A-B.

Still referring to FIG. 38, an underfill 212 may be formed under the core substrate 250, in accordance with some embodiments. The underfill 212 may surround and protect the conductive connectors 210. The underfill 312 may be formed by a capillary flow process after the core substrate 250 is attached or may be formed by a suitable deposition method before the core substrate 250 is attached. The underfill 212 may be a molding compound, epoxy, underfill, molding underfill (MUF), resin or the like, and may be similar to the underfill 212 described previously for FIG. 15.

Figure 39:
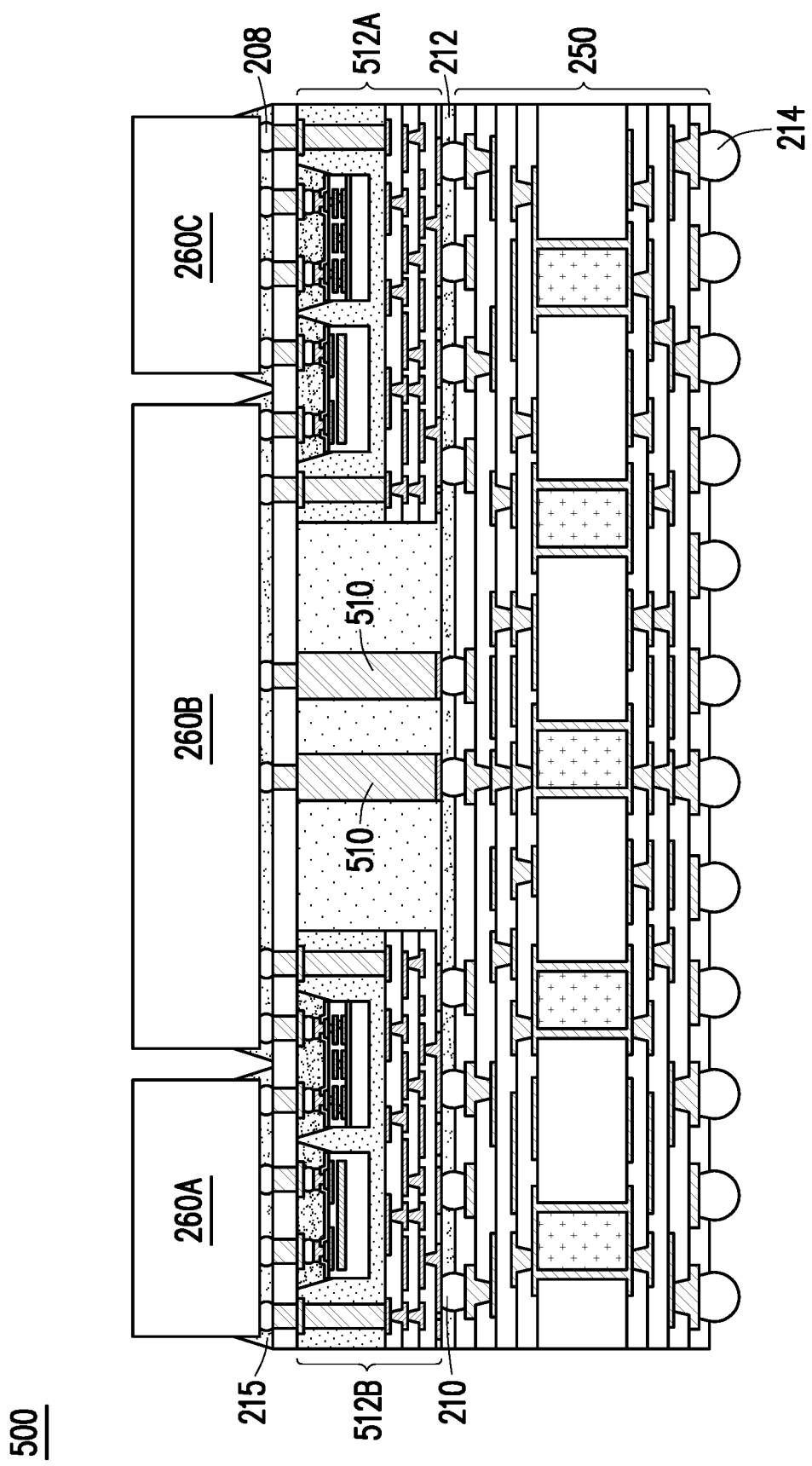

FIG. 39 illustrates the attachment of semiconductor devices 260A-C to form a package 500, in accordance with some embodiments. The semiconductor devices 260A-C are physically and electrically connected to the conductive connectors 208 to make electrical connection between the semiconductor devices 260A-C, the through vias 510, and the interconnect structures 512A-B. FIG. 39 shows only the semiconductor device 260B being directly coupled to the through vias 510, but in other embodiments the through vias 510 may be directly coupled to a different semiconductor device 260 or multiple semiconductor devices 260. The semiconductor devices 260A-C may be similar to the semiconductor devices 260A-C described previously for FIG. 16. FIG. 39 shows the attachment of three semiconductor devices 260A-C, but in other embodiments, one, two, or more than three semiconductor devices 260 may be attached to the conductive connectors 208. The semiconductor devices 260A-C may be attached in a different arrangement or configuration than shown.

The semiconductor devices 260A-C may be attached to the conductive connectors 208 using a process similar to that described for FIG. 16. For example, the semiconductor devices 260A-C may be placed on the conductive connectors 208 and a reflow process may be utilized to bond the conductive connectors 208 to the semiconductor devices 260A-C, forming the package 500. The process shown in FIGS. 31 through 39 is a "chip-last" process in which the semiconductor devices 260A-C are attached after the core substrate 250 is attached. In other embodiments, the semiconductor devices 260A-C may be attached before the core substrate 250 is attached. As shown in FIG. 39, an underfill 215 may be deposited under the semiconductor devices 260A-C. The underfill 215 may be similar to the underfill 215 described for FIG. 16, and may be formed in a similar manner.

In some cases, forming packages with multiple smaller interconnect structures (e.g., interconnect structures 100) rather than with a single larger redistribution structure can improve yield and reduce processing cost. As described herein, a package may be formed with multiple smaller interconnect structures that can together provide the same functionality as a single larger redistribution structure, such as electrical routing. In some embodiments, the interconnect structures can include interconnect components 50 or IPDs 80 that provide additional functionality.

In some cases, processing defects due to fall-on particles, contamination, in-line defects, or the like can cause opens or shorts in conductive lines or conductive vias. In some cases, the relatively larger area of a single redistribution structure increases the chance of defects occurring during processing, which may cause the entire package to fail. By forming multiple smaller interconnect structures as described herein, a single occurrence of a localized defect may cause a single interconnect structure to fail rather than an entire package. Each interconnect structure can undergo testing for known-good units prior to incorporation within the package, reducing the chance of a package failing due to a defect within an interconnect structure. In this manner, the yield of manufacturing packages may be improved. Additionally, in some cases, the use of smaller interconnect structures can reduce warping or issues due to misalignment. In some cases, the use of multiple interconnect structures may allow for a yield of greater than about 80%, though other yields are possible.

Forming a package comprising multiple interconnect structures rather than a single redistribution structure can improve the gross yield of the packages, which can reduce manufacturing cost. For example, in some cases, a greater number of unsingulated interconnect structures may be formed per wafer than the number of single redistribution structures may be formed per wafer. This is shown in FIGS. 40A-D and 41A-B, which illustrate example layouts of schematic plan views of packages, wafers, and structures formed thereon. The layouts shown in FIGS. 40A-D and 41A-B are shown for illustrative purposes, and the embodiments described herein may be formed using other layouts, arrangements, or configurations than shown in these examples.

Figure 40B:
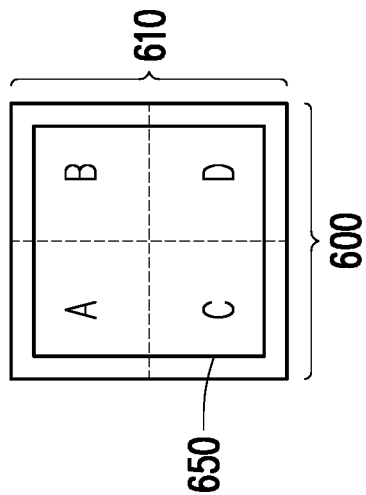
FIGS. 40A, 40B, 40C, and 40D illustrate plan views of intermediate steps in the formation of packages, in accordance with some embodiments.
Figure 40A:
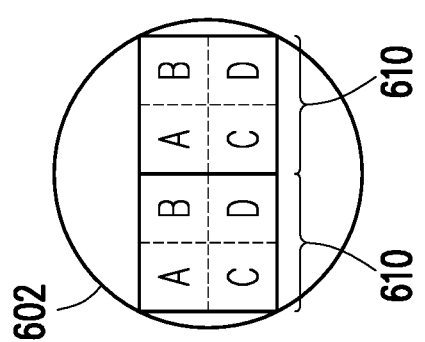

Turning to FIGS. 40A-D, FIG. 40A shows an example layout of a wafer 602 on which redistribution structures 610 have been formed as part of the manufacturing of packages 600 (see FIG. 40B), in accordance with some embodiments. The wafer 602 may be similar to the first carrier substrate 102 described previously, such as a silicon wafer or the like. For explanatory purposes, the redistribution structures 610 each show four functional regions labeled "A," "B," "C," and "D" that represent regions of the redistribution structures 610 having a particular function. The functional regions A-D may include, for example, electrical routing or the like. As shown in FIG. 40A, for the example sizes of the wafer 602 and the redistribution structures 610 shown, two redistribution structures 610 may be simultaneously formed on a single wafer 602. For example, the redistribution structures 610 may each have an area of about 130 mm² and the wafer 602 may be a 12-inch wafer, but other sizes are possible.

The two redistribution structures 610 shown in FIG. 40A may be subsequently singulated as part of forming packages 600. FIG. 40B shows a plan view of an example package 600 that includes a redistribution structure 610 attached to a core substrate 650. The core substrate 650 may be similar to the core substrate 250 described for FIG. 14. In this example, processing one wafer 602 results in two packages 600, corresponding to two packages 600 per wafer overall.

Figure 40D:
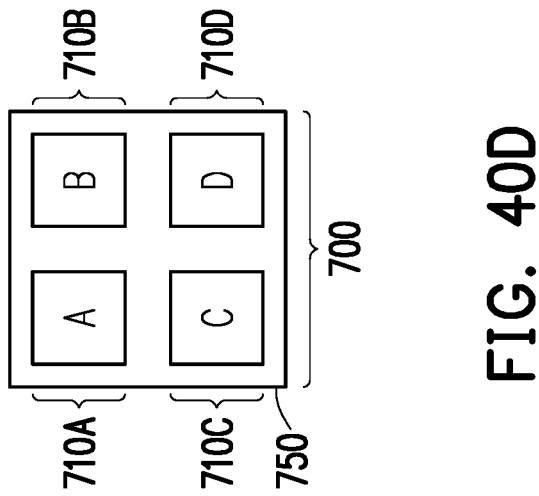
Figure 40C:
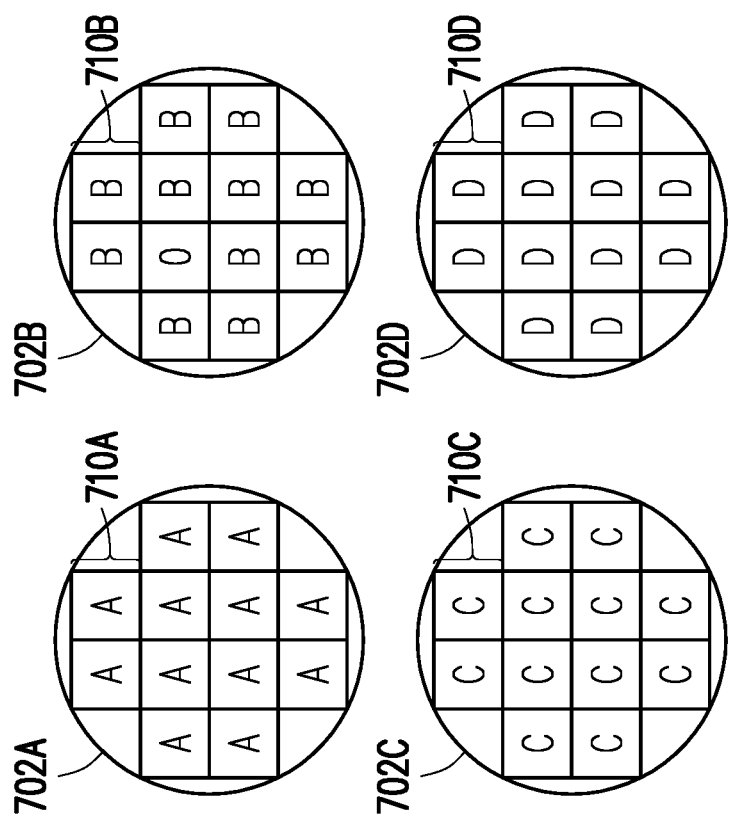

FIG. 40C shows example layouts of wafers 702A-D on which interconnect structures 710A-D have been formed as part of the manufacturing of packages 700 (see FIG. 40D), in accordance with some embodiments. The wafers 702A-D may be similar to the first carrier substrate 102 described previously, such as a silicon wafer or the like, and may have a size similar to that of the wafer 602. For explanatory purposes, each interconnect structure 710A-D is associated with a different functional region A-D of the redistribution structures 610. For example, the interconnect structure 710A corresponds to the functionality of the functional region A of the redistribution structure 610. In this manner, the four types of interconnect structures 710A-D together may have the same functionality as one redistribution structure 610. As shown in FIG. 40C, for the example sizes of the wafers 702A-D and the interconnect structures 710A-D shown, twelve of each interconnect structure 710A-D may be simultaneously formed on each corresponding single wafer 702A-D. For example, the interconnect structures 710A-D may each have an area of about 32 mm² and the wafers 702A-D may be 12-inch wafers, but other sizes are possible.

The interconnect structures 710A-D shown in FIG. 40C may be subsequently singulated as part of forming packages 700. FIG. 40D shows a plan view of an example package 700 that includes one of each interconnect structures 710A-D attached to a core substrate 750. The core substrate 750 may be similar to the core substrate 250 described for FIG. 14. In this example, processing four wafers 702A-D results in twelve packages 700, corresponding to three packages 700 per wafer overall. Thus, in this example, forming multiple interconnect structures 710A-D rather than a single redistribution structure 610 can increase gross units per wafer by 50% for the same size of wafer. As described above, forming multiple interconnect structures 710A-D rather than a single redistribution structure 610 can improve yield. For example, a single defect on a wafer 602 during processing can reduce yield by one package 600 out of two possible packages 600 (e.g., 50% yield reduction), but a single defect on each of the wafers 702A-D only reduces yield by one package 700 out of twelve possible packages 700 (e.g., about 8% yield reduction).

The redistribution structures 610 and the interconnect structures 710A-D are illustrative examples, and the functionality (e.g., partitions A, B, C, and D), size, shape, arrangement, or number of redistribution structures 610 or interconnect structures 710 may be different in other cases. For example, the package 700 shown in FIG. 40D may be larger, smaller, or about the same size as the package 600 shown in FIG. 40A.

FIGS. 41A-B and 42A-B illustrate additional example layouts for redistribution structures and interconnect structures of other sizes, in accordance with some embodiments. FIG. 41A-B illustrate wafers 602 and 702A-D on which redistribution structures 612 and interconnect structures 712A-D have been formed as part of the manufacturing of packages (not individually shown). The wafers 602 and 702A-D may be similar to those described for FIGS. 40A-D. The redistribution structures 612 and interconnect structures 712A-D may be similar to the redistribution structures 610 and interconnect structures 710A-D described for FIGS. 40A-D, except that the redistribution structures 612 and interconnect structures 712A-D have a smaller size. For example, the redistribution structures 612 may have an area of about 110 mm² and the interconnect structures 712A-D may each have an area of about 27.5 mm², though other sizes are possible. As shown in FIG. 41A, three redistribution structures 612 may be simultaneously formed on a single wafer 602, corresponding to three packages per wafer overall. As shown in FIG. 41B, sixteen of each interconnect structure 712A-D may be simultaneously formed on each corresponding single wafer 702A-D corresponding to four packages per wafer overall. Thus, in this example, forming multiple interconnect structures 712A-D rather than a single redistribution structure 612 can increase gross units per wafer by 33% for the same size of wafer.

Figure 42B:
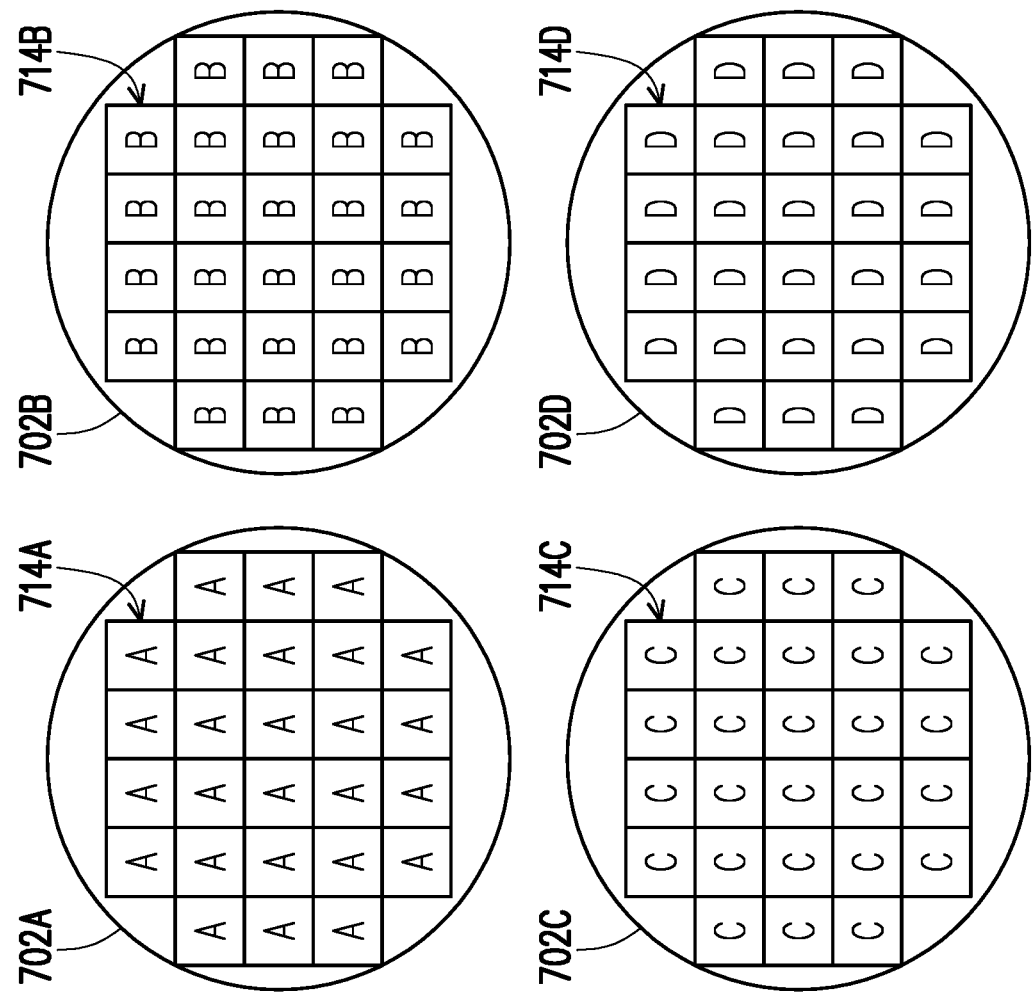
FIGS. 42A and 42B illustrate plan views of intermediate steps in the formation of packages, in accordance with some embodiments.
Figure 42A:
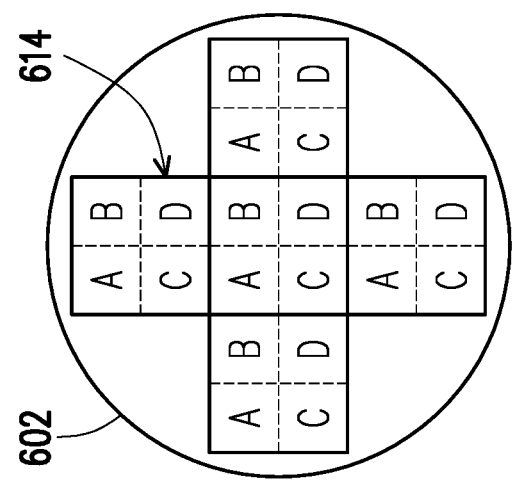

FIG. 42A-B illustrate wafers 602 and 702A-D on which redistribution structures 614 and interconnect structures 714A-D have been formed as part of the manufacturing of packages (not individually shown). The wafers 602 and 702A-D may be similar to those described for FIGS. 40A-D. The redistribution structures 614 and interconnect structures 714A-D may be similar to the redistribution structures 610 and interconnect structures 710A-D described for FIGS. 40A-D, except that the redistribution structures 614 and interconnect structures 714A-D have a smaller size. For example, the redistribution structures 614 may have an area of about 91 mm² and the interconnect structures 714A-D may each have an area of about 23 mm², though other sizes are possible. As shown in FIG. 42A, five redistribution structures 614 may be simultaneously formed on a single wafer 602, corresponding to five packages per wafer overall. As shown in FIG. 42B, twenty-six of each interconnect structure 714A-D may be simultaneously formed on each corresponding single wafer 702A-D corresponding to six and a half packages per wafer overall. Thus, in this example, forming multiple interconnect structures 714A-D rather than a single redistribution structure 614 can increase gross units per wafer by 30% for the same size of wafer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. By forming a package including multiple interconnect structures attached to one or more core substrates as described herein, yield may be improved and the number of units per wafer may be improved, which can reduce processing cost. The process described herein also allows for forming interconnect structures of a package that are smaller than the core substrate(s) of the package. The interconnect structures may include components such as interconnect components having electrical routing, IPDs, through vias, or the like, which can allow for design flexibility and performance improvement. The use of interconnect structures also allows for semiconductor devices to be attached before attaching the core substrate(s) or after attaching the core substrate(s) (e.g., "chip-last"). The use of interconnect structures allows for larger through vias to be formed either in an interconnect structure or adjacent to the interconnect structures, which can provide benefits for higher-power operation of the package.

In accordance with some embodiments of the present disclosure, a method includes attaching interconnect structures to a carrier substrate, wherein each interconnect structure includes a redistribution structure; a first encapsulant on the redistribution structure; and a via extending through the encapsulant to physically and electrically connect to the redistribution structure; depositing a second encapsulant on the interconnect structures, wherein adjacent interconnect structures are laterally separated by the second encapsulant; after depositing the second encapsulant, attaching a first core substrate to the redistribution structure of at least one interconnect structure, wherein the core substrate is electrically connected to the redistribution structure; and attaching semiconductor devices to the interconnect structures, wherein the semiconductor devices are electrically connected to the vias of the interconnect structures. In an embodiment, at least one interconnect structure includes an interconnect component, wherein the interconnect component is surrounded by the first encapsulant, wherein the interconnect component includes electrical routing. In an embodiment, the semiconductor devices are electrically connected to the interconnect components of the interconnect structures. In an embodiment, at least one interconnect structure includes an integrated passive device (IPD). In an embodiment, the semiconductor devices are attached after attaching the first core substrate. In an embodiment, the method includes attaching a second core substrate to the redistribution structure of at least one interconnect structure, wherein the core substrate is electrically connected to the redistribution structure. In an embodiment, the method includes depositing an underfill between the first core substrate and the interconnect structures. In an embodiment, the method includes forming through vias on the carrier substrate, wherein the second encapsulant is deposited on the through vias. In an embodiment, the via of a first interconnect structure has a larger width than the via of a second interconnect structure.

In accordance with some embodiments of the present disclosure, a method includes forming a first interconnect structure, which includes forming first vias on a first carrier; depositing a first molding material over the first vias; forming a redistribution structure on the first vias and a first side of the first molding material, wherein the redistribution structure is electrically connected to the first vias; and forming second vias on the first vias and a second side of the first molding material opposite the first side, wherein the second vias are electrically connected to the first vias; forming a connection structure, which includes placing the first interconnect structure and a second interconnect structure on a second carrier, and depositing a second molding material between the first interconnect structure and the second interconnect structure; connecting a first core substrate to the connection structure, wherein the first core substrate is connected to the redistribution structure of the first interconnect structure; and connecting a first semiconductor device to the connection structure, wherein the first semiconductor device is connected to the second vias of the first interconnect structure. In an embodiment, the method includes performing a planarization process the second molding material, the first interconnect structure, and the second interconnect structure, wherein after performing a planarization process, the second molding material and the second vias of the first interconnect structure are coplanar. In an embodiment, the second interconnect structure includes a redistribution structure, and wherein the first core substrate is connected to the redistribution structure of the second interconnect structure. In an embodiment, forming the first interconnect structure includes placing an integrated passive device (IPD) on the first carrier and depositing the first molding material over the IPD, wherein the second vias are formed over and electrically connected to the IPD. In an embodiment, the method includes connecting a second core substrate to the connection structure, wherein the second core substrate is free of connection to the redistribution structure of the first interconnect structure. In an embodiment, a sidewall of the first core substrate protrudes beyond a sidewall of the connection structure. In an embodiment, connecting the first core substrate to the connection structure includes bonding the first core substrate to the connection structure using solder bumps.

In accordance with some embodiments of the present disclosure, a package includes a substrate electrically connected to respective first sides of multiple interconnect structures, wherein the interconnect structures are individually at least partially surrounded by an encapsulant, wherein the interconnect structures individually include a redistribution structure; a through via on the redistribution structure; and an integrated device; and semiconductor devices electrically connected to respective second sides of the interconnect structures, wherein the second side is opposite the first side. In an embodiment the integrated device is a local routing structure. In an embodiment, the integrated device is isolated from the through via and the redistribution structure by a molding material. In an embodiment, at least one semiconductor device is electrically connected to at least two of the interconnect structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   attaching a plurality of interconnect structures to a carrier substrate, wherein each interconnect structure of the plurality of interconnect structures individually comprises:
      a redistribution structure;
      a first encapsulant on the redistribution structure;
      an interconnect component in the first encapsulant, the interconnect component comprising electrical routing, the interconnect component being surrounded by the first encapsulant, the interconnect component and the redistribution structure being vertically separated by the first encapsulant;
      a via extending through the first encapsulant to physically and electrically connect to the redistribution structure;
   depositing a second encapsulant on the plurality of interconnect structures, wherein adjacent interconnect structures of the plurality of interconnect structures are laterally separated by the second encapsulant;
   after depositing the second encapsulant and removing the carrier substrate;
   after depositing the second encapsulant and the removing the carrier substrate, attaching a first core substrate to the redistribution structure of at least one interconnect structure of the plurality of interconnect structures, wherein the first core substrate is electrically connected directly to the redistribution structure, wherein the first core substrate is attached to a first side of the plurality of interconnect structures; and
   attaching a plurality of semiconductor devices to the plurality of interconnect structures, wherein each semiconductor device of the plurality of semiconductor devices is electrically connected to the via of a respective interconnect structure of the plurality of interconnect structures, wherein the plurality of semiconductor devices are attached to a second side of the plurality of interconnect structures that is opposite the first side.

2. The method of claim 1, wherein each semiconductor device of the plurality of semiconductor devices is electrically connected to the interconnect component of a respective interconnect structure of the plurality of interconnect structures.

3. The method of claim 1, wherein the at least one interconnect structure of the plurality of interconnect structures further comprises an integrated passive device (IPD).

4. The method of claim 1, wherein the plurality of semiconductor devices are attached after attaching the first core substrate.

5. The method of claim 1, further comprising depositing an underfill between the first core substrate and the plurality of interconnect structures.

6. The method of claim 1, wherein the via of a first interconnect structure of the plurality of interconnect structures has a larger width than the via of a second interconnect structure of the plurality of interconnect structures.

7. A method, comprising:
   forming a first interconnect structure, comprising:
      forming first vias on a first carrier;
      depositing a first molding material over the first vias and the first carrier;
      forming a redistribution structure on the first vias and a first side of the first molding material, wherein the redistribution structure is electrically connected to the first vias;
      removing the first carrier; and
      forming second vias on the first vias and a second side of the first molding material opposite the first side, wherein the second vias are electrically connected to the first vias;
   after forming the second vias on the first vias, forming a connection structure, comprising:
      placing the first interconnect structure and a second interconnect structure on a second carrier;
      depositing a second molding material between the first interconnect structure and the second interconnect structure; and
      performing a planarization process on the second molding material, the first interconnect structure, and the second interconnect structure, wherein after performing the planarization process, the second molding material and the second vias of the first interconnect structure are coplanar;
   connecting a first core substrate to the connection structure, wherein the first core substrate is connected to the redistribution structure of the first interconnect structure; and
   connecting a first semiconductor device to the connection structure, wherein the first semiconductor device is connected to the second vias of the first interconnect structure, wherein forming the first interconnect structure further comprises placing an integrated passive device (IPD) on the first carrier and depositing the first molding material over the IPD, wherein the second vias are formed over and electrically connected to the IPD.

8. The method of claim 7, wherein the second interconnect structure comprises a redistribution structure, and wherein the first core substrate is connected to the redistribution structure of the second interconnect structure.

9. The method of claim 7, wherein a sidewall of the first core substrate protrudes beyond a sidewall of the connection structure.

10. The method of claim 7, wherein connecting the first core substrate to the connection structure comprises bonding the first core substrate to the connection structure using solder bumps.

11. A method comprising:
  connecting a redistribution substrate to a plurality of interconnect structures, wherein each interconnect structure of the plurality of interconnect structures respectively comprises:
    a redistribution structure;
    a first encapsulant on the redistribution structure, the redistribution structure being on a first side of the first encapsulant;
    a through via on the redistribution structure and extending through the first encapsulant;
    an integrated device adjacent the through via, wherein the integrated device is surrounded by the first encapsulant; and
    a first conductive via on the through via and a second conductive via on the integrated device, the first and second conductive vias being on a second side of the first encapsulant opposite the first side;
  depositing a second encapsulant on the plurality of interconnect structures, wherein the second encapsulant separates adjacent interconnect structures of the plurality of interconnect structures, wherein the second encapsulant physically contacts the first encapsulant, wherein the redistribution substrate is free of the second encapsulant;
  performing a planarization process on the second encapsulant and at least one of the plurality of interconnect structures, wherein after performing the planarization process, the second encapsulant and the first and second conductive vias of the at least one of the plurality of interconnect structures are coplanar; and
  connecting a plurality of semiconductor devices to the plurality of interconnect structures, wherein at least one semiconductor device of the plurality of semiconductor devices is connected to two adjacent interconnect structures of the plurality of interconnect structures.

12. The method of claim 11, wherein the second encapsulant is deposited on the plurality of interconnect structures before the redistribution substrate is connected to the plurality of interconnect structures.

13. The method of claim 11 further comprising depositing an underfill between the redistribution substrate and the plurality of interconnect structures.

14. The method of claim 11, wherein the redistribution substrate is connected to the redistribution structures of the plurality of interconnect structures.

15. The method of claim 11, wherein an integrated device of the plurality of interconnect structures is connected to at least two semiconductor devices of the plurality of semiconductor devices.

16. The method of claim 13, wherein the underfill physically contacts the redistribution structures of the plurality of interconnect structures.

17. The method of claim 11, wherein the integrated device of the plurality of interconnect structures comprises electrical routing.

18. The method of claim 11, further comprising:
  attaching the plurality of interconnect structures to a carrier substrate; and
  after depositing the second encapsulant, removing the carrier substrate.

19. The method of claim 11, wherein the at least one semiconductor device of the plurality of semiconductor devices extends from a first interconnect structure of the plurality of interconnect structures over the second encapsulant to a second interconnect structure of the plurality of interconnect structures.

* * * * *